United States Patent
Ikeda et al.

(10) Patent No.: US 8,450,845 B2
(45) Date of Patent: May 28, 2013

(54) SEMICONDUCTOR DEVICE

(75) Inventors: Yoshinari Ikeda, Matsumoto (JP); Shin Soyano, Shiojiri (JP); Akira Morozumi, Okaya (JP); Kenji Suzuki, Azumino (JP); Yoshikazu Takahashi, Matsumoto (JP)

(73) Assignee: Fuji Electric Co., Ltd., Kawasaki-Shi (JP)

( * ) Notice: Subject to any disclaimer, the term of this patent is extended or adjusted under 35 U.S.C. 154(b) by 39 days.

(21) Appl. No.: 12/735,926

(22) PCT Filed: Apr. 8, 2009

(86) PCT No.: PCT/JP2009/057162
§ 371 (c)(1),
(2), (4) Date: Oct. 25, 2010

(87) PCT Pub. No.: WO2009/125779
PCT Pub. Date: Oct. 15, 2009

(65) Prior Publication Data
US 2011/0037166 A1 Feb. 17, 2011

(30) Foreign Application Priority Data
Apr. 9, 2008 (JP) .................................. 2008-101371

(51) Int. Cl.
*H01L 23/34* (2006.01)
(52) U.S. Cl.
USPC .................. 257/712; 257/E23.101; 257/706; 257/720; 438/122; 438/125
(58) Field of Classification Search
CPC ................................ H01L 23/34; H01L 21/00
USPC .................. 257/E23.101, E21.002, 618, 659, 257/688, 691, 706, 707, 712–714, 718, 720, 257/E21.418, E29.257, 341; 438/122, FOR. 413,125; 106/31.49, 31.58; 347/100
See application file for complete search history.

(56) References Cited

U.S. PATENT DOCUMENTS
4,392,153 A * 7/1983 Glascock et al. ............. 257/746
6,380,622 B1 * 4/2002 Hirai et al. .................... 257/712
(Continued)

FOREIGN PATENT DOCUMENTS
JP 2004-22844 A 1/2004
JP 2005-54248 A 3/2005
(Continued)

OTHER PUBLICATIONS
Japan Patent Office, "Office Action for JP 2010-507253", Sep. 18, 2012.

*Primary Examiner* — Chris Chu
(74) *Attorney, Agent, or Firm* — Manabu Kanesaka

(57) ABSTRACT

The object of the present invention is to efficiently dissipate heat from the upper and lower main surfaces of a semiconductor device carrying a semiconductor element. A semiconductor device (1) is provided with an insulating substrate (10A), an insulating substrate (10B) provided so as to face the insulating substrate (10A), and a semiconductor element (20) disposed between the insulating substrate (10A) and the insulating substrate (10B) and having a collector electrode and an emitter electrode provided on the side opposite to that of the collector electrode. The collector electrode is electrically connected to a metal foil (10ac) provided on the insulating substrate (10A), and the emitter electrode is electrically connected to the metal foil (10bc) provided on the insulating substrate (10B). As a result, heat generated by the semiconductor element (20) is efficiently dissipated from the upper and lower main surfaces of the semiconductor device (1).

4 Claims, 13 Drawing Sheets

U.S. PATENT DOCUMENTS

| | | | |
|---|---|---|---|
| 6,448,645 B1* | 9/2002 | Kimura et al. | 257/735 |
| 6,845,012 B2* | 1/2005 | Ohkouchi | 361/704 |
| 6,891,256 B2* | 5/2005 | Joshi et al. | 257/676 |
| 6,963,133 B2* | 11/2005 | Teshima | 257/718 |
| 6,992,383 B2* | 1/2006 | Mamitsu et al. | 257/718 |
| 7,030,317 B1* | 4/2006 | Oman | 174/541 |
| 7,091,603 B2* | 8/2006 | Mamitsu et al. | 257/706 |
| 7,250,674 B2* | 7/2007 | Inoue | 257/712 |
| 7,271,477 B2* | 9/2007 | Saito et al. | 257/686 |
| 7,456,492 B2 | 11/2008 | Mochida | 257/659 |
| 7,547,966 B2 | 6/2009 | Funakoshi et al. | 257/707 |
| 7,564,124 B2* | 7/2009 | Lee et al. | 257/675 |
| 7,671,465 B2 | 3/2010 | Funakoshi et al. | 257/706 |
| 7,957,135 B2* | 6/2011 | Ohkouchi et al. | 361/679.54 |
| 2007/0216013 A1* | 9/2007 | Funakoshi et al. | 257/691 |

FOREIGN PATENT DOCUMENTS

| | | |
|---|---|---|
| JP | 2005-123233 A | 5/2005 |
| JP | 2006-134990 A | 5/2006 |
| JP | 2006-165498 A | 6/2006 |
| JP | 2007-27794 A | 2/2007 |
| JP | 2007-251076 A | 9/2007 |

* cited by examiner

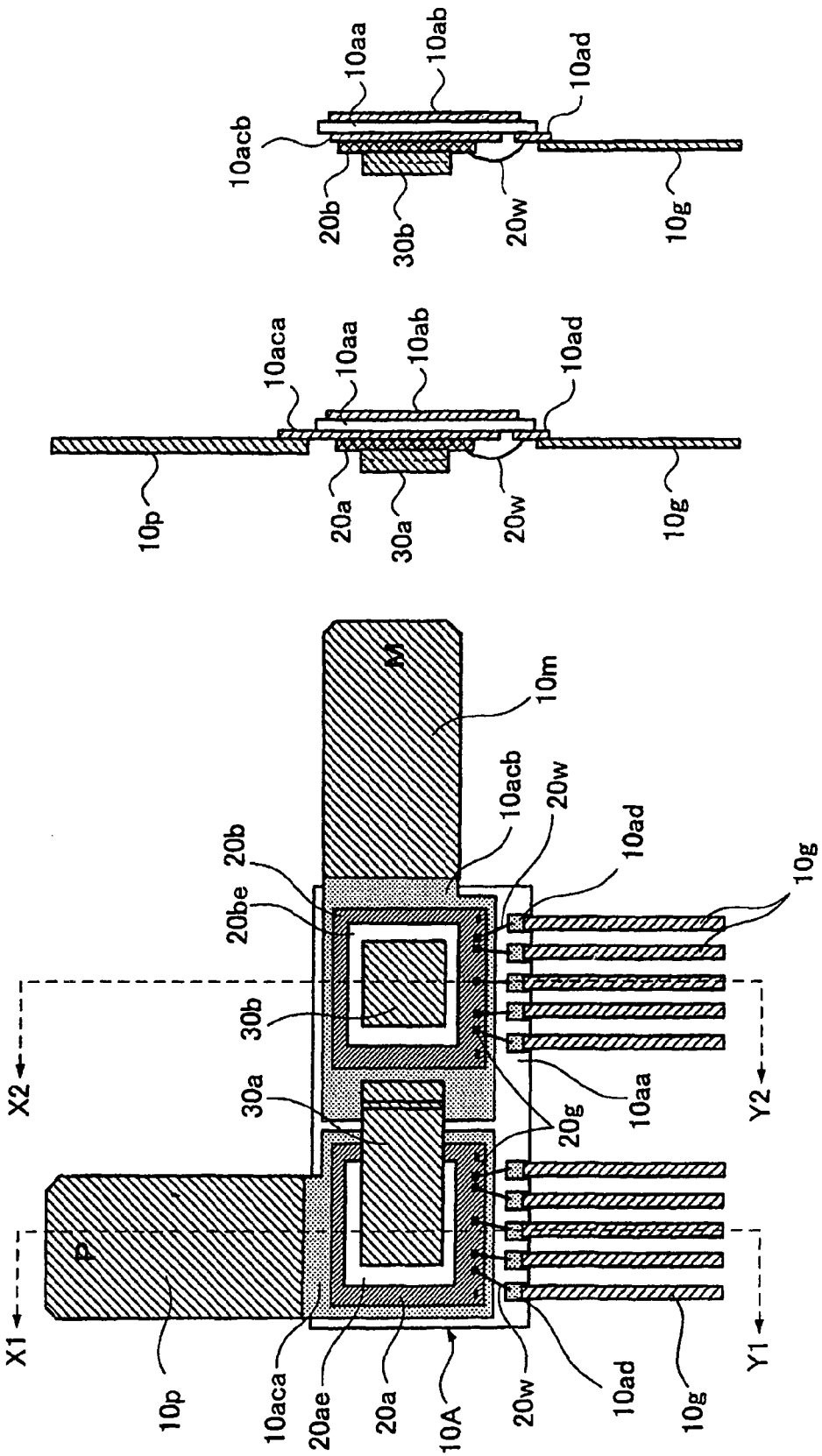

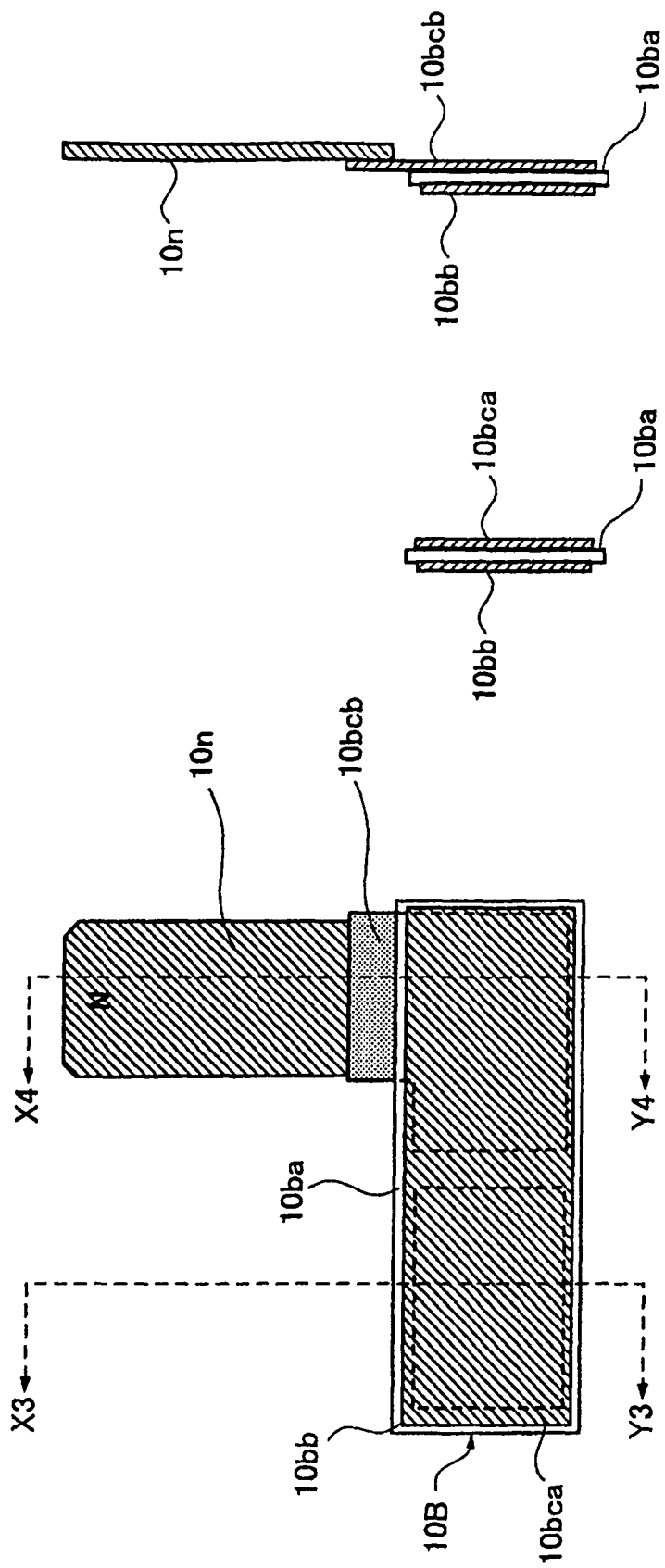

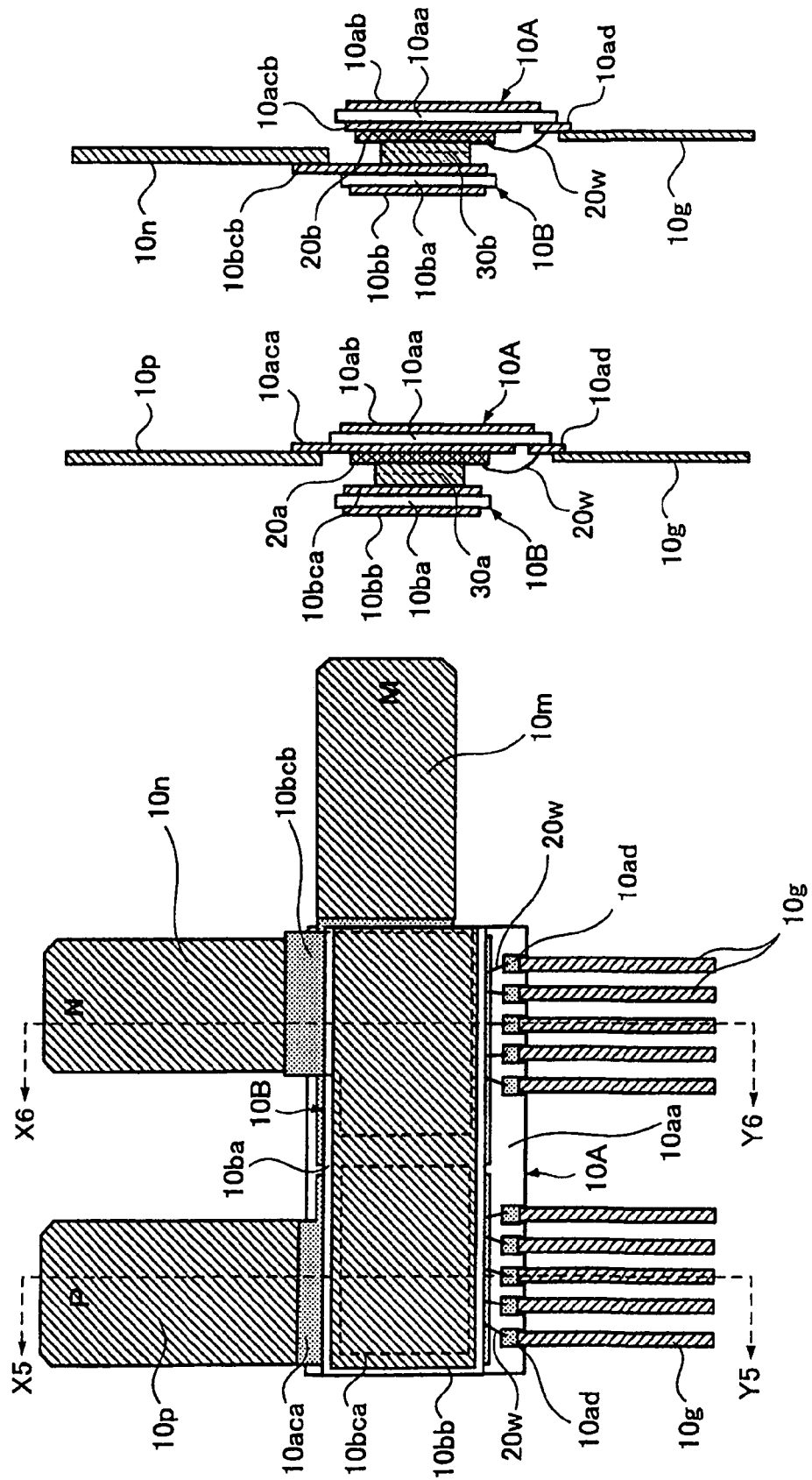

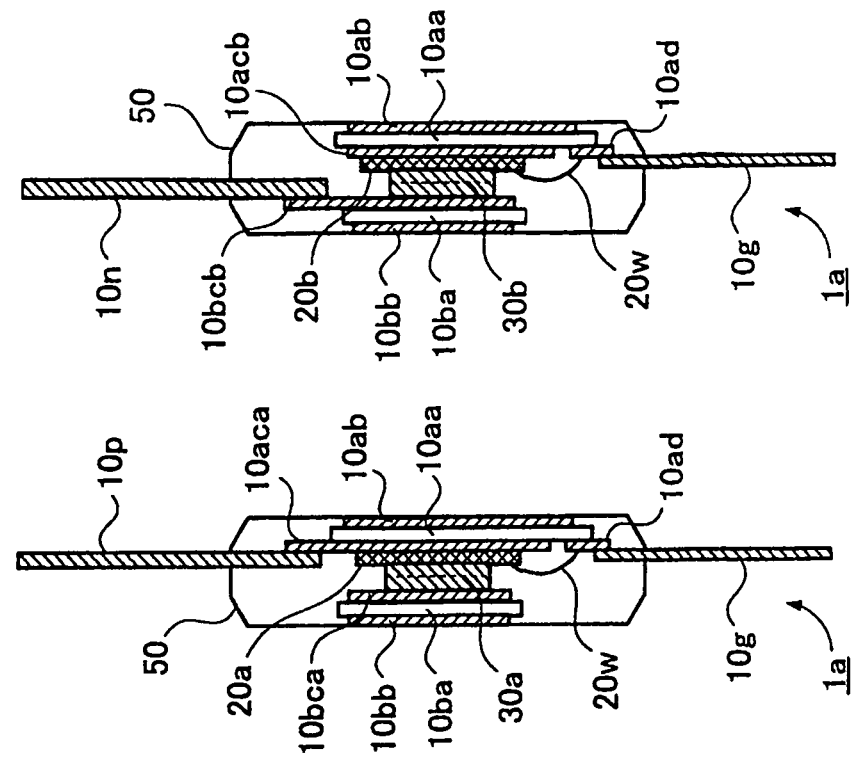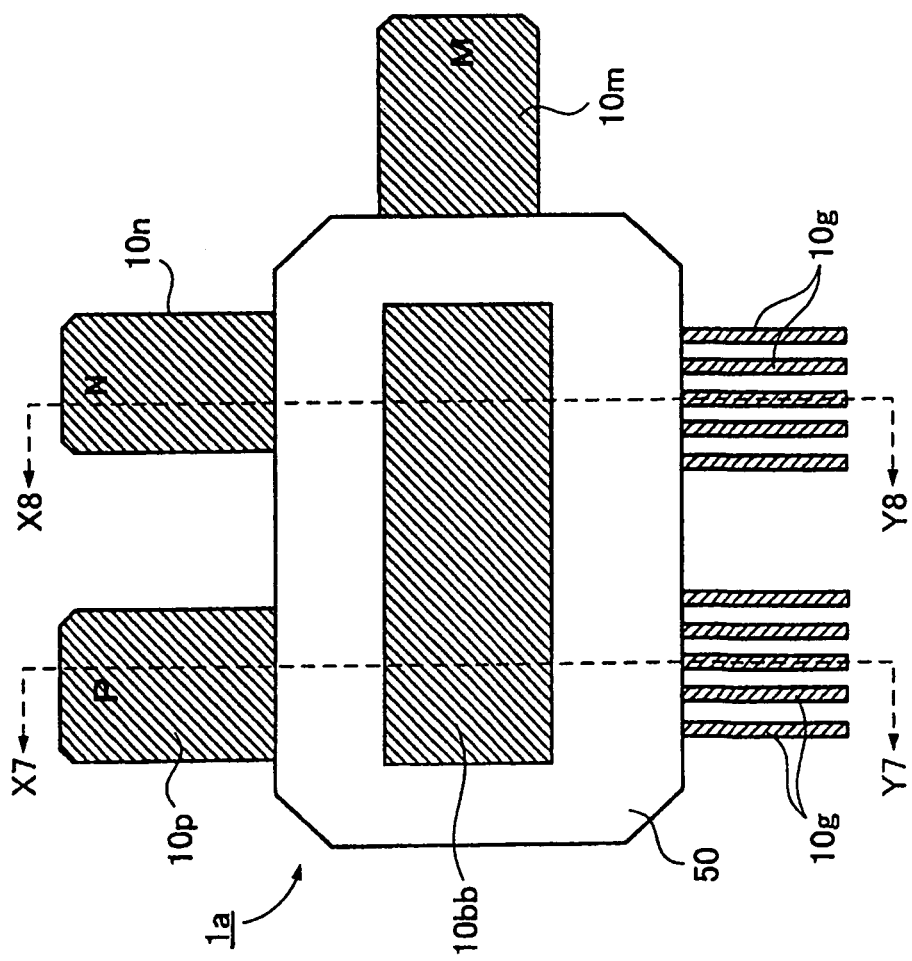

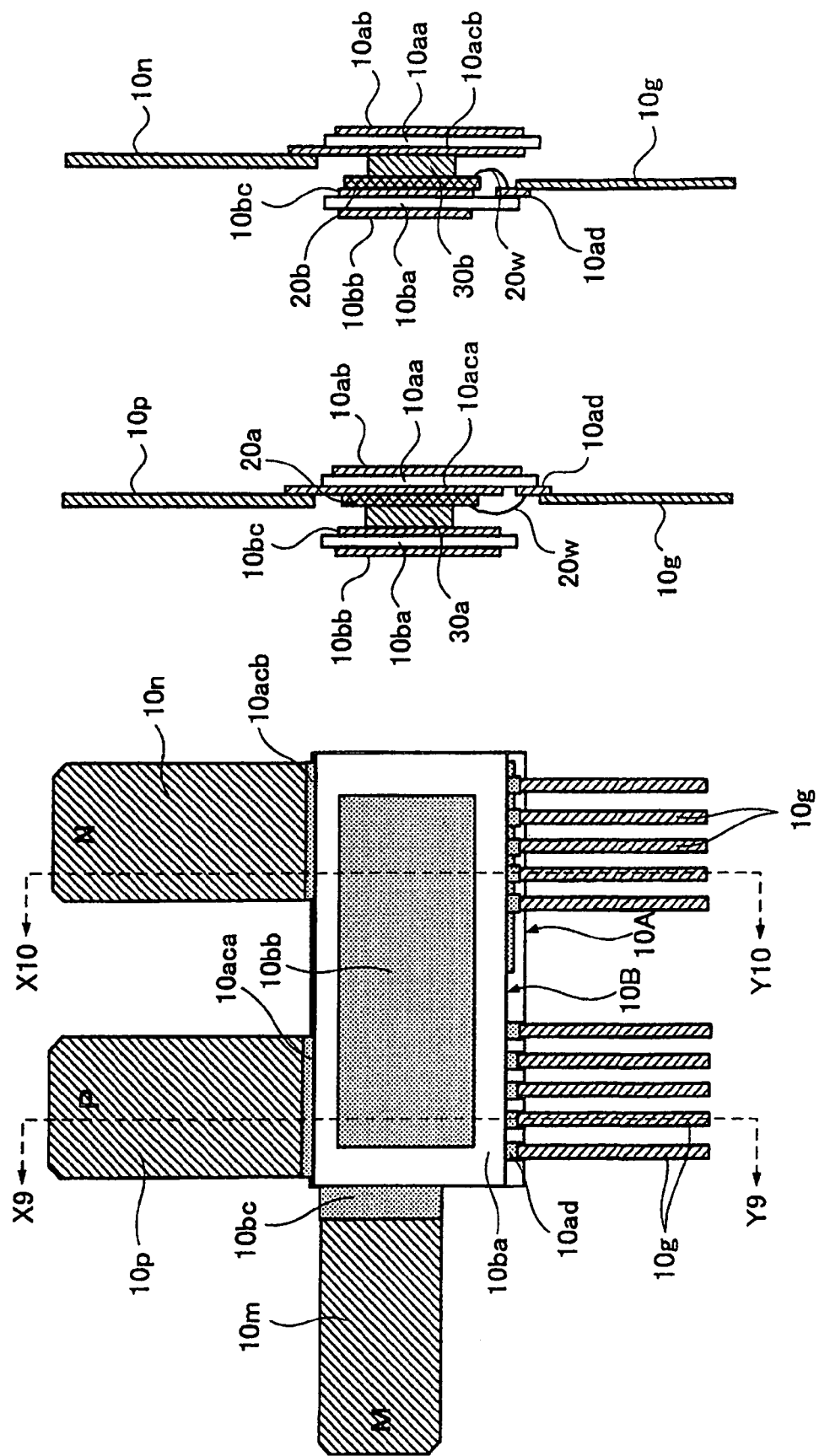

SEMICONDUCTOR DEVICE

TECHNICAL FIELD

The present invention relates to a semiconductor device carrying a power semiconductor element.

BACKGROUND ART

In inverter devices, uninterrupted power supply devices, machine tools, and industrial robots, semiconductor devices (semiconductor packages), which are independent from the main device and carries a power semiconductor elements, are used.

For example, FIG. 16 is a principal view of a semiconductor deviance carrying a power semiconductor element.

As shown in the figure, in a semiconductor device 100, a parallel connection circuit is provided between a metal bar 130a and a metal bar 130b by bringing main electrodes of an IGBT (Insulated Gate Bipolar Transistor) element 110Na and electrodes of a diode 110Nb into contact respectively with the bars, a parallel connection circuit is provided between the metal bar 130b and a metal bar 130c by bringing main electrodes of an IGBT element 110Pa and electrodes of a diode 110Pb into contact respectively with the bars, the parallel connection circuits are connected respectively in series via the metal bar 130b and sealed with a resin, and the IGBT elements, diodes, and metal bars are electrically connected by a shrinkage pressure of a sealing resin 150 (see, for example, Patent Document 1).

In the semiconductor device 100 having such a configuration, heat generated from the IGBT element 110Na and the diode 110Nb is easily conducted to a heat-dissipating fin 170N. Heat generated from the IGBT element 110Pa and the diode 110Pb is easily conducted to a heat-dissipating fin 170P. The semiconductor device 100 thus has a structure in which heat is conducted to one surface side of each heat-generating semiconductor element, and heat dissipation is facilitated.

Further, it has also been suggested to attempt heat dissipation from both the upper and lower surface sides of semiconductor elements (see, for example, Patent Documents 2 and 3).

A technique has also been known by which a semiconductor element is thermally connected to a cooling body via a thermal compound, a resin sheet, or an insulating layer formed by an aerosol deposition method (see, for example, Patent Document 4).

Patent Document 1: Japanese Patent Application Laid-open No. 2006-134990
Patent Document 2: Japanese Patent Application Laid-open No. 2004-22844
Patent Document 3: Japanese Patent Application Laid-open No. 2007-173680
Patent Document 4: Japanese Patent Application Laid-open No. 2006-165498

However, with some configurations of the conventional semiconductor devices, heat dissipation ability is insufficient and device reliability is reduced, or the increase in heat dissipation ability prevents the devices from being reduced in thickness and miniaturized.

DISCLOSURE OF THE INVENTION

With the foregoing in view, it is the object of the present invention to provide a semiconductor device in which heat generated from the semiconductor elements carried by the device can be efficiently dissipated and also to provide a method for manufacturing such a semiconductor device.

In order to solve the above-described problem, according to one aspect of the present invention, a semiconductor device includes: a first substrate comprising a first insulating plate, a first metal foil having a portion provided in a region on the inner side from the ends of a first main surface of the first insulating plate, and a second metal foil having a portion provided in a region on the inner side from the ends of a second main surface of the first insulating plate; a second substrate comprising a second insulating plate, a third metal foil having a portion provided in a region on the inner side from the end of a first main surface of the second insulating plate, and a fourth metal foil having a portion provided in a region on the inner side from ends of a second main surface of the second insulating plate, where the third metal foil is disposed so as to face the first metal foil; a semiconductor element having a first main electrode provided between the first substrate and the second substrate, and electrically connected to the first metal foil, and a second main electrode electrically connected to the third metal foil; and a sealing resin that seals the semiconductor element, wherein the sealing resin covers side surfaces and end surfaces of the first insulating plate on the outer side from the first metal foil and the second metal foil, side surfaces and end surfaces of the second insulating plate on the outer side from the third metal foil and the fourth metal foil, and side surfaces of the second metal foil and the fourth metal foil; and a main surface of the second metal foil on the side opposite to that of the first insulating plate, and a main surface of the fourth metal foil on the side opposite to that of the second insulating plate are exposed from the sealing resin.

According to one aspect of the present invention, a semiconductor device includes: a first metal plate; a second metal plate provided as to face opposite to the first metal plate; a semiconductor element disposed between the first metal plate and the second metal plate and electrically connected to the first metal plate and the second metal plate; a first deposited layer with insulating properties formed on a main surface of the first metal plate on the side opposite to that of the semiconductor element; and a second deposited layer with insulating properties formed on a main surface of the second metal plate on the side opposite to that of the semiconductor element.

According to one aspect of the present invention, a method for manufacturing a semiconductor device includes the steps of: forming a first substrate by providing the first metal foil and the second metal foil on one main surface of a first insulating plate; facing a first main electrode provided on one main surface of a first semiconductor element to the first metal foil, and electrically connecting the first main electrode and the first metal foil; facing a second main electrode provided on one main surface of a second semiconductor element to the second metal foil, and electrically connecting the second main electrode and the second metal foil; forming a second substrate by providing third and fourth metal foils on one main surface of a second insulating plate; and arranging a surface side of the second substrate where the third metal foil and the fourth metal foil are provided, so as to face a surface side of the first substrate where the first semiconductor element and the second semiconductor element are disposed, electrically connecting the third metal foil and a third main electrode provided on a main surface of the first semiconductor element on the side opposite to that of the main surface where the first main electrode is provided, and electrically connecting the fourth metal foil and a fourth main electrode provided on a main surface of the second semiconductor element on the side opposite to that of the main surface where the second main electrode is provided.

According to one aspect of the present invention, a method for manufacturing a semiconductor device includes the steps of: forming a first substrate by providing first and second metal foils on one main surface of a first insulating plate; facing a first main electrode provided on one main surface of a first semiconductor element to the first metal foil, and electrically connecting the first main electrode and the first metal foil; forming a second substrate by providing a third metal foil on one main surface of a second insulating plate; facing a second main electrode provided on one main surface of a second semiconductor element, to the third metal foil, and electrically connecting the second main electrode and the third metal foil; and arranging a surface side of the second substrate where the second semiconductor element is disposed so as to face a surface side of the first substrate where the first semiconductor element is disposed, and electrically connecting the third metal foil and a third main electrode provided on a main surface of the first semiconductor element on the side opposite to that of the main surface where the first main electrode is provided, and electrically connecting the second metal foil and a fourth main electrode provided on a main surface of the second semiconductor element on the side opposite to that of the main surface where the second main electrode is provided.

According to one aspect of the present invention, a method for manufacturing a semiconductor device includes the steps of: forming a first substrate by providing a first metal foil on one main surface of a first insulating plate; facing a first main electrode provided on one main surface of a first semiconductor element to the first metal foil and electrically connecting the first main electrode and the first metal foil; facing a second main electrode provided on one main surface of a second semiconductor element to the first metal foil and electrically connecting the second main electrode and the first metal foil; forming a second substrate by providing a second metal foil on one main surface of a second insulating plate; and arranging a surface side of the second substrate where the second metal foil is provided so as to face a surface side of the first substrate where the first and second semiconductor elements are disposed and electrically connecting by using the second metal foil, a third main electrode provided on a main surface of the first semiconductor element on the side opposite to that of the main surface where the first main electrode is provided and a fourth main electrode provided on a main surface of the second semiconductor element on the side opposite to that of the main surface where the second main electrode is provided.

According to the disclosed semiconductor device and method for manufacturing, it is possible to realize a highly reliable semiconductor device in which heat generated from the mounted semiconductor element can be efficiently dissipated to the upper and lower main surface sides of the semiconductor device.

The description mentioned above and other objects, features, and advantages of the present invention will be apparent from the description below and accompanied drawings that illustrate the preferred embodiments of the present invention.

BRIEF DESCRIPTION OF THE DRAWINGS

FIGS. 2(A)-2(C) are a principal schematic view illustrating a method for manufacturing a semiconductor device according to the first embodiment (first view).

FIGS. 3(A)-3(C) are a principal schematic view illustrating a method for manufacturing a semiconductor device according to the first embodiment (second view).

FIGS. 4(A)-4(C) are a principal schematic view illustrating a method for manufacturing a semiconductor device according to the first embodiment (third view).

FIGS. 5(A)-5(B) are a principal schematic view illustrating a method for manufacturing a semiconductor device according to the first embodiment (fourth view).

FIGS. 6(A)-6(C) are a principal schematic view illustrating another method for manufacturing a semiconductor device according to the first embodiment (first view).

FIGS. 7(A)-7(C) are a principal schematic view illustrating another method for manufacturing a semiconductor device according to the first embodiment (second view).

Figure 1:
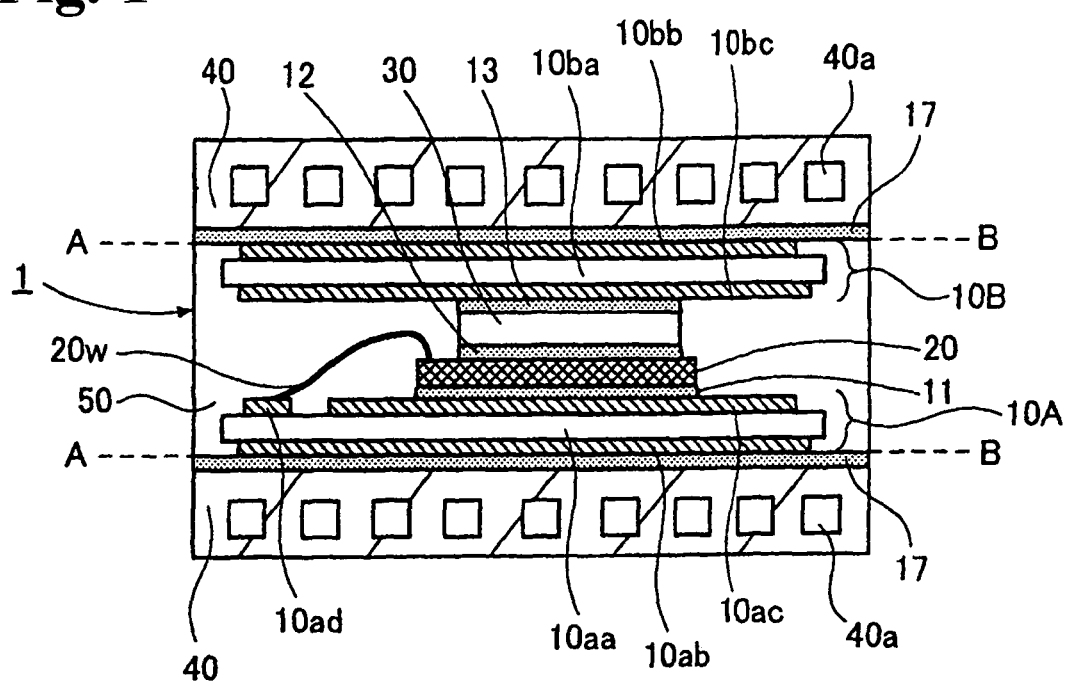
FIG. 1 is a schematic view of a semiconductor device according to the first embodiment.

EXPLANATION OF REFERENCE SYMBOLS 1, 1a, 1b, 2, 3, 4, 5 semiconductor device
10A, 10B insulating substrate
10aa, 10ba, 10ga insulating plate
10c, 10e, 10m, 10n, 10p, 71, 72 external connection electrode
10ab, 10ac, 10ad, 10bb, 10bc, 10aca, 10acb, 10bca, 10bcb, 10gb metal foil
10ada, 10adb insulating layer
10g control terminal
11, 12, 13, 14, 15, 16 solder layer
17 connection member
20, 20a, 20b semiconductor element
20ae, 20be emitter electrode
20g control electrode
20w metal wire
30, 30a, 30b, 33A, 33B, 34 metal plate
31, 32 metal block body
40 heat-dissipating fin
40a flow channel
50 sealing resin
61, 62 nozzle
70 structural body 73 tie bar

BEST MODE FOR CARRYING OUT THE INVENTION

<First Embodiment>

FIG. 1 is a schematic view of a semiconductor device according to the first embodiment.

As shown in the figure, in a semiconductor device (semiconductor package) 1, an insulating substrate 10A is taken as a base body, and at least one semiconductor element 20 is mounted on the insulating substrate 10A with a lead-free solder layer 11 of a tin (SN)-silver (Ag) system being interposed therebetween.

The insulating substrate 10A is provided with an insulating plate 10aa, a metal foil 10ab provided on the lower surface of the insulating plate 10aa, and metal foils 10ac, 10ad provided on the upper surface of the insulating plate 10aa. The metal foil 10ab and the metal foils 10ac, 10ad are selectively and respectively provided on the upper and lower surface of the insulating plate 10aa and separated by the insulating plate 10aa. The metal foil 10ab provided on the lower surface of the insulating plate 10aa includes a portion provided in a region of the insulating plate 10aa that is on the inner side from the ends of the lower surface. Likewise, the metal foils 10ac, 10ad provided on the upper surface of the insulating plate 10aa include portions provided in a region of the insulating plate 10aa that is on the inner side from the ends of the upper surface. In the insulating substrate 10A, the metal foil 10ab is thus provided in a predetermined region of the lower surface, and the metal foils 10ac, 10ad are provided in predetermined regions of the upper surface of the insulating plate 10aa. For example, when copper (Cu) or a metal containing copper (Cu) as the main component is used for the metal foils 10ab, 10ac, 10ad provided on the insulating plate 10aa, the metal foils 10ab, 10ac, 10ad can be formed on the insulating plate 10aa, for example, by using a DCB (Direct Copper Bonding) method.

Further, in addition to the aforementioned lead-free solder of a tin (Sn)-silver (Ag) system, a lead-free solder of a tin (Sn)-antimony (Sb) system may be used as the solder material of the solder layer 11 provided between the insulating substrate 10A and the semiconductor element 20. When a lead-free solder of a tin (Sn)-antimony (Sb) system is used, a characteristic of thermal fatigue resistance can be further improved.

Further, the semiconductor element 20 is the so-called power semiconductor element and, for example, corresponds to a RC (Reverse Conducting)-IGBT element. In addition to the RC-IGBT element, for example, a usual IGBT element, a power MOSFET (Metal Oxide Semiconductor Field Effect Transistor), and a FWD (Free Wheeling Diode) element may be used as the semiconductor element 20.

In the semiconductor device 1, one main electrode (for example, a collector electrode) of the semiconductor element 20 is joined to the metal foil 10ac via the solder layer 11. A metal plate 30 that functions as a heat spreader or a lead frame is joined via a lead-free solder layer 12 to the other main electrode (for example, an emitter electrode) provided on the main surface on the side opposite to that of the main surface where the aforementioned one main electrode (for example, the collector electrode) of the semiconductor element 20 is disposed. A control electrode (not shown in the figure) of the semiconductor element 20 that is separately provided on the surface side where the other main electrode (for example, the emitter electrode) is disposed and the metal foil 10ad are electrically connected by means of a metal wire 20w.

Further, in the semiconductor device 1, a separate insulating substrate 10B that is a base body is disposed opposite the insulating substrate 10A.

The insulating substrate 10B is provided with an insulating plate 10ba, a metal foil 10bb provided on the upper surface of the insulating plate 10ba, and a metal foil 10bc provided on the lower surface of the insulating plate 10ba. The metal foil 10bb and the metal foil 10bc are selectively and respectively provided on the upper and lower surface of the insulating plate 10ba and separated by the insulating plate 10ba. The metal foil 10bb provided on the upper surface of the insulating plate 10ba includes a portion provided in a region of the insulating plate 10ba that is on the inner side from the ends of the upper surface. Likewise, the metal foils 10bc provided on the lower surface of the insulating plate 10ba includes a portion provided in a region of the insulating plate 10ba that is on the inner side from the ends of the lower surface. In the insulating substrate 10B, the metal foil 10bb is thus provided in a predetermined region of the upper surface, and the metal foil 10bc is provided in a predetermined region of the lower surface of the insulating plate 10ba. For example, when copper (Cu) or a metal containing copper (Cu) as the main component is used for the metal foils 10bb, 10bc provided on the insulating plate 10ba, the metal foils 10bb, 10bc can be formed on the insulating plate 10ba, for example, by using the DCB method.

The metal plate 30 disposed above the insulating substrate 10A and the metal foil 10bc of the insulating substrate 10B are joined via a lead-free solder layer 13.

The insulating substrates 10A, 10B, metal plate 30, and semiconductor element 20 are electrically and thermally connected to each other.

Further, in the semiconductor device 1, a sealing resin 50 is provided in a gap between the insulating substrates 10A, 10B and on the side surfaces thereof with the object of protecting the insulating substrates 10A, 10B, semiconductor element 20, and metal wire 20w. The main surfaces of the metal foils 10ab, 10bb provided on the sides of the insulating substrates 10A, 10B that are opposite those facing the semiconductor element 20 are exposed from the sealing resin 50 and exhibited, that is, not covered by the sealing resin 50. In the semiconductor device 1, flat surfaces are formed by the main surfaces of the metal foils 10ab, 10bb, and also main surfaces (surfaces along the broken lines A-B in the figure) constituted by parts of the sealing resin 50.

As shown in FIG. 1, the sealing resin 50 is formed such as to seal the semiconductor element 20 and also cover the side surfaces of the metal foil 10ab provided on the lower surface of the insulating plate 10aa, end surfaces of the lower surface of the insulating plate 10aa where the metal foil 10ab is not provided, side surfaces of the insulating plate 10aa, end surfaces of the upper surface of the insulating plate 10aa where the metal foils 10ac, 10ad are not provided, and also side surfaces and upper surfaces of the metal foils 10ac, 10ad. Likewise, the sealing resin 50 covers the side surfaces of the metal foil 10bb provided on the upper surface of the insulating plate 10ba, end surfaces of the upper surface of the insulating plate 10ba where the metal foil 10bb is not provided, side surfaces of the insulating plate 10ba, end surfaces of the lower surface of the insulating plate 10ba where the metal foil 10bc is not provided, and side surfaces and lower surface of the metal foil 10bc.

Thus, the sealing resin 50 is formed such as to cover the steps formed by the insulating plate 10aa and the metal foils 10ab, 10ac, 10ad in the end portions of the insulating substrate 10A and also to cover the steps formed by the insulating plate 10ba and the metal foils 10bb, 10bc in the end portions of the insulating substrate 10B. As a result, the bonding area of the sealing resin 50 and the end portions of the insulating substrates 10A, 10B increases over that in the case in which such steps have not been formed, that is, the case in which the side surface positions of the insulating plates and metal foils are mated. Therefore, bonding ability of the insulating substrates 10A, 10B, and the sealing resin 50 can be increased. In particular, when a ceramic material containing oxygen, for example such as alumina ($Al_2O_3$), is used for the insulating plates 10aa, 10ba, the oxygen of the insulating plates 10aa, 10ba contributes to the bonding with the sealing resin 50 and bonding ability can be further increased.

Further, where steps are thus formed by the insulating plate 10aa and metal foils 10ab, 10ac, 10ad at the end portions of the insulating substrate 10A, a creepage distance between the metal foil 10ab of the lower surface and the metal foils 10ac, 10ad of the upper surface becomes larger than in the case in which the side surface positions of the insulating plate and metal foils are mated and no step is formed. As a result, insulating ability thereof is increased. Likewise, where steps are thus formed by the insulating plate 10ba and metal foils 10bb, 10bc at the end portions of the insulating substrate 10B, a creepage distance between the metal foil 10bb of the upper surface and the metal foil 10bc of the lower surface becomes larger than in the case in which no step is formed. As a result, insulating ability thereof is increased. Further, since the end portions of the insulating substrates 10A, 10B where such a step is present is covered by the sealing resin 50, the insulating ability is further improved.

Further, in the semiconductor device 1, a heat-dissipating fin 40 is thermally connected via a connection member 17 to the metal foil 10ab provided in the insulating substrate 10A. Further, a heat-dissipating fin 40 is also thermally connected via a connection member 17 to the metal foil 10bb provided in the insulating substrate 10B. In this case, for example, a conductive compound, a lead-free solder material of a tin (Sn)-silver (Ag) system, or a solder material of a tin (Sn)-lead (Pb) system can be used for the connection member 17. The connection member 17 can be formed over the entire flat surface along the broken line A-B, and also can be formed selectively, for example, between the metal foil 10ab and the heat-dissipating fin 40 and between the metal foil 10bb and the heat-dissipating fin 40. When a solder material is used for the connection member 17, the metal foils 10ab, 10bb, and heat-dissipating fins 40 can be strongly joined by via the solder material to perform reflow processing.

The heat-dissipating fin 40 may be of a water-cooled system in which a liquid such as water is caused to flow as a coolant in a flow channel 40a, or of an air-cooled system in which a gas such as air is caused to flow as the coolant. If necessary, the heat-dissipating fins 40 may be directly, that is, not via the connection members 17, joined by pressurization to the metal foils 10ab, 10bb, by clamping from the outside.

For example, a ceramic material containing at least any one of silicon nitride (SiN), alumina ($Al_2O_3$), and aluminum nitride (AlN) can be used for the above-described insulating plates 10aa, 10ba.

For example, copper (Cu) or a metal containing copper (Cu) as the main component can be used for the metal foils 10ab, 10ac, 10ad, 10bb, and 10bc.

For example, a material containing copper (Cu), or aluminum (Al), or alloys thereof as the main component can be also used for heat-dissipating fin 40.

For example, aluminum (Al) and gold (Au) can be used for the metal wire 20w.

For example, any of silicone gel, an epoxy resin, a cyanate resin, and a silicone resin can be used as the sealing resin 50.

If necessary, a filler material constituted by an inorganic material (boron nitride (BN), aluminum nitride (AlN), and silicon nitride (SiN)) may be contained in the resin.

The thickness of the insulating plates 10aa, 10ba is 0.2 mm to 0.7 mm, and the thickness of the metal foils 10ab, 10ac, 10ad, 10bb, and 10bc is 0.2 mm to 1.0 mm.

Where such thin insulating substrates 10A, 10B are provided above and below the semiconductor element 20, and the components are connected, heat generated from the semiconductor element 20 can be efficiently conducted from the upper and lower main surfaces of the semiconductor element 20 to the upper and lower heat-dissipating fins 40 via the insulating substrate 10A and the insulating substrate 10B.

Thus, the semiconductor device 1 has good electrical connection to the metal foil 10ac provided on the insulating substrate 10A and to the metal foil 10bc provided on the insulating substrate 10B in the upper and lower main electrodes of the semiconductor element 20. At the same time, heat generated from the semiconductor element 20 can be efficiently conducted from the upper and lower main surfaces of the semiconductor element 20 to the upper and lower heat-emitting fins 40 via the insulating substrate 10A and the insulating substrate 10B. As a result, reliability of the semiconductor device 1 can be increased.

A method for assembling (manufacturing) a semiconductor device will be described below in greater detail by taking a semiconductor device of the so-called 2 in 1 structure (a package in which two element are carried in one package) by way of example. FIGS. 2(A) to 7(C) below illustrate an example in which one arm of an inverter circuit is manufactured, but this example is not particularly limiting. Further, a solder layer introduced between the members is herein omitted in the figures, but this layer can be formed by performing the so-called reflow processing on a paste-like or a sheet-like solder material. By forming such a solder layer, it is possible to ensure electrical connection between the members.

FIGS. 2(A), 2(B), and 2(C) are a principal schematic view illustrating a method for manufacturing a semiconductor device according to the first embodiment. FIG. 2(A) is a principal plan view of a portion of the semiconductor device. FIG. 2(B) is a cross-sectional cut-out view taken along X1-Y1 in FIG. 2(A). FIG. 2(C) is a cross-sectional cut-out view taken along X2-Y2 in FIG. 2(A).

As shown in the figure, the insulating substrate 10A is formed by disposing the metal foil 10ab on the lower surface of the insulating plate 10aa, for example, by the DCB method, and disposing the metal foils 10aca, 10acb, 10ad on the upper surface of the insulating plate 10aa, for example, by the DCB method. Parts of the metal foils 10aca, 10acb protrudes from the end of the insulating plate 10aa.

Contact electrodes located on the lower surface of the semiconductor elements 20a, 20b that are RC-IGBT elements are joined to the metal foils 10aca, 10acb, respectively, via the solder layer 11.

A metal plate 30a, which functions as a lead frame, is joined via the solder layer 12 to an emitter electrode 20ae, which is provided on the upper surface side of the semiconductor element 20a. A metal plate 30b, which functions as a lead frame, is joined via the solder layer 12 to an emitter electrode 20be, which is provided on the upper surface side of the semiconductor element 20b.

Control electrodes 20g of the semiconductor elements 20a, 20b and the metal foil 10ad are electrically connected by means of a metal wire 20w.

As shown in FIG. 2(A), the metal plate 30a joined to the emitter electrode 20ae of the semiconductor element 20a is extended from the emitter electrode 20ae towards the semiconductor element 20b, and the end portion of the metal plate 30a is electrically connected to the metal foil 10acb. The electrical connection of the end portion and the metal foil 10acb can be performed by soldering, ultrasonic joining, or laser welding.

The heights (for example, height above the main surface of the insulating plate 10aa) of the metal plates 30a, 30b joined to the emitter electrodes 20ae, 20be are preferably adjusted to the same value.

An external connection terminal 10p serving as a positive electrode input terminal is electrically connected to the portion of the metal foil 10aca that extends from the insulating plate 10aa. Further, an external connection terminal 10m serving as an AC output terminal is electrically connected to a portion of the metal foil 10acb that extends from the insulating plate 10aa.

A plurality of control terminals 10g is electrically and respectively connected to a plurality of metal foils 10ad provided on the insulating plate 10aa, and the control terminals 10g and the control electrodes 20g are electrically connected to each other by the metal wire 20w and the metal foil 10ad.

The external connection terminals 10p, 10m, metal foils 10aca, 10acb, control terminal 10g, and the metal foil 10ad can be electrically connected by any method such as laser welding, soldering, ultrasonic joining, and direct joining by heating under pressure.

According to the above-described method, the control terminals 10g are connected to the metal foil 10ad by forming the insulating substrate 10A, soldering by the solder layer 11 of the semiconductor elements 20a, 20b, soldering by the solder layer 12 of the metal plates 30a, 30b, and then electrically connecting the control electrode 20g and the metal foil 10ad, and electrically connecting the external connection terminals 10p, 10m and the metal foils 10aca, 10acb. Where the control terminals 10g are thus attached at a later stage of the process, thermal history of the control terminals 10g in the semiconductor device formation process can be shortened.

For example, when a terminal-integrated lead frame is used that is formed by punching the control terminals, the soldering of semiconductor elements and meal plates is conducted to such terminal-integrated lead frame. However, in this case, the terminal portion of the lead frame is also exposed to heat during soldering. Therefore, as the terminals are miniaturized, the terminals can be easily deformed by heat. Such deformation of the terminals can cause various inconveniences; for example, making it impossible to insert the terminals into predetermined holes provided in the wiring substrate or connecting the terminals to the predetermined positions on the wiring substrate.

By contrast, where the control terminals 10g are attached at a later stage, as described herein above, thermal history of the control terminals 10g can be shortened by comparison with the case in which a terminal-integrated lead frame is used and the deformation of the control terminals 10g by heat can be effectively inhibited. Further, since such an attachment of the control terminals 10g at a later stage makes it possible to inhibit the deformation of the control terminals, the control terminals 10g can be easily miniaturized, and a pitch between the control terminals 10g can be easily reduced.

In this way, a first unit is prepared by being provided with the insulating substrate 10A having metal foils 10aca, 10acb provided thereon, the semiconductor element 20a in which a collector electrode is joined to the metal foil 10aca, the semiconductor element 20b in which a collector electrode is joined to the metal foil 10acb, and the external connection terminals 10p, 10m.

FIGS. 3(A), 3(B), and 3(C) are a principal schematic diagram illustrating a method for manufacturing a semiconductor device according to the first embodiment. FIG. 3(A) is a principal plan view of a portion of the semiconductor device. FIG. 3(B) is a cross-sectional cut-out view taken along X3-Y3 in FIG. 3(A). FIG. 3(C) is a cross-sectional cut-out view taken along X4-Y4 in FIG. 3(A).

First, the insulating substrate 10B is formed by disposing the metal foil 10bb on the upper surface of the insulating plate 10ba, for example, by the DCB method, and disposing the metal foils 10bca, 10bcb on the lower surface of the insulating plate 10ba, for example, by the DCB method. A part of the metal foil 10bcb protrudes from the end of the insulating plate 10ba.

An external connection terminal 10n serving as a negative electrode input terminal is electrically connected to the portion of the metal foil 10bcb that extends from the insulating plate 10ba. The external connection terminal 10n and metal foil 10bcb can be electrically connected by any method such as laser welding, soldering, ultrasonic joining, and direct joining by heating under pressure.

A second unit is thus prepared that has the insulating substrate 10B having metal foils 10bca, 10bcb provided thereon and the external connection terminal 10n.

FIGS. 4(A), 4(B), and 4(C) are a principal schematic diagram illustrating a method for manufacturing a semiconductor device according to the first embodiment. FIG. 4(A) is a principal plan view of a portion of the semiconductor device. FIG. 4(B) is a cross-sectional cut-out view taken along X5-Y5 in FIG. 4(A). FIG. 4(C) is a cross-sectional cut-out view taken along X6-Y6 in FIG. 4(A).

First, one main surface of the first unit shown by way of example in FIGS. 2(A) to 2(C) and one main surface of the second unit shown by way of example in FIGS. 3(A) to 3(C) are disposed opposite to each other and aligned so that the metal plates 30a, 30b and the metal foils 10bca, 10bcb are opposite to each other. The metal plate 30a and the metal foil 10bca, and also the metal plate 30b and the metal foil 10bcb are joined together via the solder layer 13.

As a result, a state is assumed in which a collector electrode of the semiconductor element 20a is electrically connected to an emitter electrode 20ae provided on the side opposite to the collector electrode, and a collector electrode of the semiconductor element 20b is electrically connected to an emitter electrode 20be provided on the side opposite to the collector electrode.

Thus, the emitter electrode 20ae of the semiconductor element 20a and the collector electrode of the semiconductor element 20b are connected in series by the metal plate 30a and the metal foil 10acb. Further, the external connection terminal 10p serving as a positive electrode input terminal is electrically connected via the metal foil 10aca to the collector electrode of the semiconductor element 20a, and the external connection terminal 10n serving as a negative electrode input terminal is electrically connected via the metal foil 10bcb to an emitter electrode 20be of the semiconductor element 20b. The external connection terminal 10m serving as an AC output terminal is electrically connected via the metal foil 10acb to an intermediate node in which the emitter electrode 20ae of the semiconductor element 20a and the collector electrode of the semiconductor element 20b are connected in series.

The insulating substrates 10A, 10B, metal plates 30a, 30b, and semiconductor elements 20a, 20b are thus electrically connected and also thermally connected.

FIGS. 5(A), 5(B), and 5(C) are a principal schematic view illustrating a method for manufacturing a semiconductor device according to the first embodiment. FIG. 5(A) is a principal plan view of a portion of the semiconductor device. FIG. 5(B) is a cross-sectional cut-out view taken along X7-Y7 in FIG. 5(A). FIG. 5(C) is a cross-sectional cut-out view taken along X8-Y8 in FIG. 5(A).

The sealing resin 50 is provided in the gap between the insulating substrates 10A, 10B and on the side surfaces of the insulating substrates with the object of protecting the insulating substrates 10A, 10B, semiconductor elements 20a, 20b, and metal wire 20w.

In this case, the sealing resin 50 is provided such that the main surface of the metal foil 10ab provided on the insulating substrate 10A and the main surface of the metal foil 10bb provided on the insulating substrate 10B are exposed from the sealing resin 50 and exhibited.

For example, the basic structure of a semiconductor device 1a having a 2 in 1 structure is completed by such a manufacturing method. Heat-dissipating fin 40 is then thermally connected via a solder material or an electrically conductive compound to the main surface of the metal foils 10ab, 10bb of the semiconductor device 1a.

The semiconductor device 1 having a 2 in 1 structure can be also formed by another assembling method (manufacturing method). This other assembling method will be explained below.

Figures 6A, 6B:
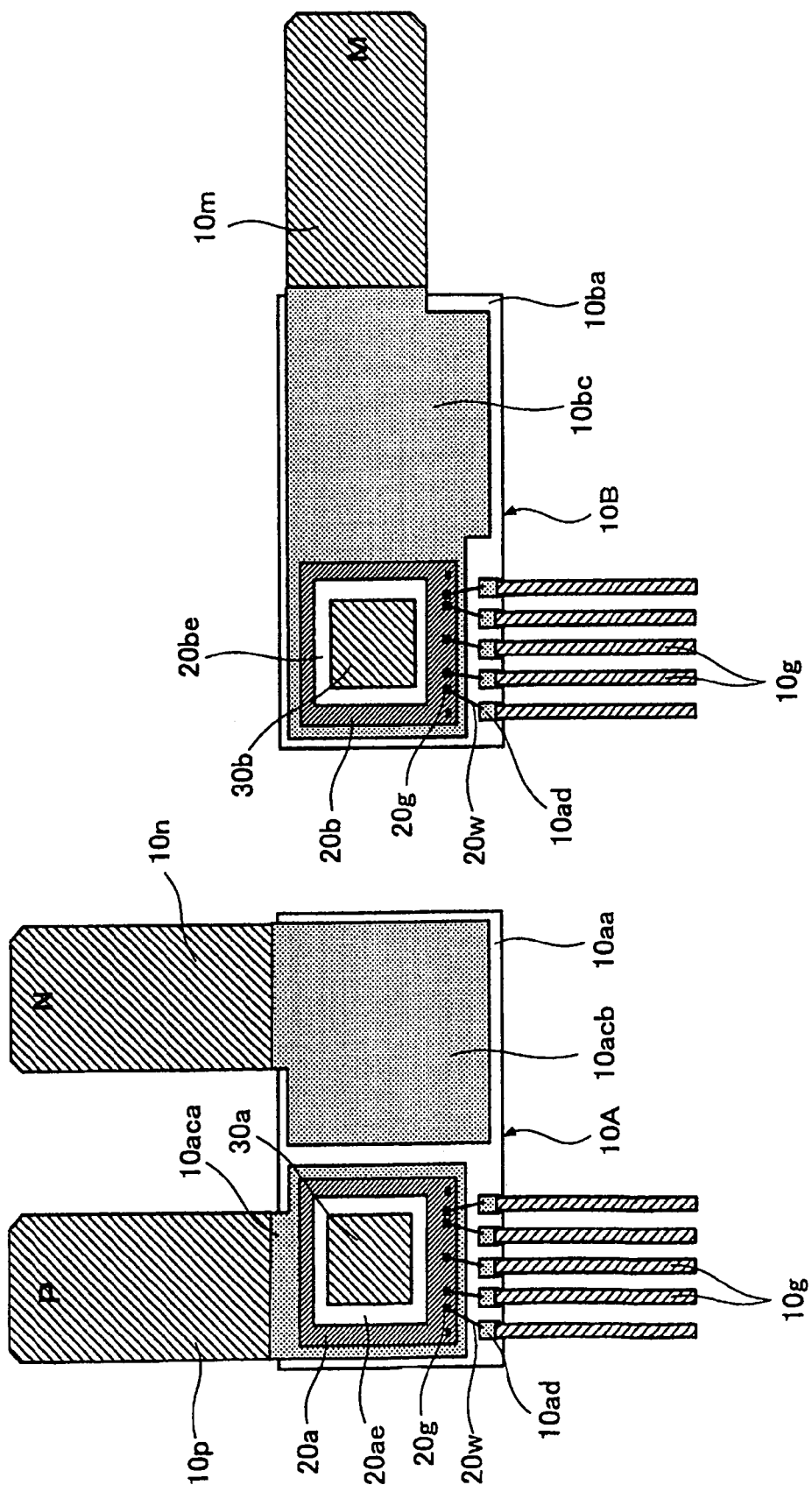

FIGS. 6(A) and 6(B) are a principal schematic view illustrating another method for manufacturing a semiconductor device according to the first embodiment. FIG. 6(A) and FIG. 6(B) are principal plan views of portions of the semiconductor device.

As shown in FIG. 6(A), a collector electrode of the semiconductor element 20a is joined via the solder layer 11 to the metal foil 10aca of the insulating substrate 10A. Further, the metal plate 30a functioning as a heat spreader is joined via the solder layer 12 to the emitter electrode 20ae on the upper surface side of the semiconductor element 20a.

Parts of the metal foils 10aca, 10acb of the insulating substrate 10A protrude from the end of the insulating plate 10aa.

The control electrode 20g of the semiconductor element 20a and the metal foil 10ad of the insulating substrate 10A are electrically connected via the metal wire 20w.

The external connection terminal 10p serving as a positive electrode input terminal is electrically connected to the portion of the metal foil 10aca that protrudes from the insulating plate 10aa. The external connection terminal 10n serving as a negative electrode input terminal is electrically connected to the portion of the metal foil 10acb that protrudes from the insulating plate 10aa.

Each of the plurality of control terminals 10g is electrically connected to a respective metal foil from the plurality of metal foils 10ad of the insulating substrate 10A. As a result, the control terminals 10g and the control electrodes 20g are electrically connected via the metal wire 20w and the metal foil 10ad.

The external connection terminals 10p, 10n and the metal foils 10aca, 10acb and also the control terminals 10g and the metal foil 10ad can be electrically connected by any method such as laser welding, soldering, ultrasonic joining, and direct joining by heating under pressure.

A first unit is thus prepared that has the insulating substrate 10A provided with the metal foils 10aca, 10acb, the semiconductor element 20a joined by the collector electrode to the metal foil 10aca, and the external connection terminals 10p, 10n.

As shown in FIG. 6(B), the collector electrode of the semiconductor element 20b is joined via the solder layer 11 to a portion of the metal foil 10bc of the insulating substrate 10B.

Further, the metal plate 30b functioning as a heat spreader is joined via the solder layer 12 to the emitter electrode 20be on the upper surface side of the semiconductor element 20b.

The metal foil 10bc of the insulating substrate 10B protrudes from the end of the insulating plate 10ba.

The control electrode 20g of the semiconductor element 20b and the metal foil 10ad of the insulating substrate 10B are electrically connected via the metal wire 20w.

The external connection terminal 10m serving as an AC output terminal is electrically connected to the portion of the metal foil 10bc that protrudes from the insulating plate 10ba.

Each of the plurality of control terminals 10g is electrically connected to a respective metal foil from the plurality of metal foils 10ad of the insulating substrate 10B. As a result, the control terminals 10g and the control electrodes 20g are electrically connected via the metal wire 20w and the metal foil 10ad.

The external connection terminal 10m and the metal foil 10bc and also the control terminals 10g and the metal foil 10ad can be electrically connected by any method such as laser welding, soldering, ultrasonic joining, and direct joining by heating under pressure.

A second unit is thus prepared that has the insulating substrate 10B provided with the metal foil 10bc, the semiconductor element 20b joined by the collector electrode to the metal foil 10bc, and the external connection terminal 10m.

FIGS. 7(A), 7(B), and 7(C) are a principal schematic view illustrating another method for manufacturing a semiconductor device according to the first embodiment. FIG. 7(A) is a principal plan view of a portion of the semiconductor device. FIG. 7(B) is a cross-sectional cut-out view taken along X9-Y9 in FIG. 7(A). FIG. 7(C) is a cross-sectional cut-out view taken along X10-Y10 in FIG. 7(A).

First, one main surface of the first unit shown by way of example in FIG. 6(A) and one main surface of the second unit shown by way of example in FIG. 6(B) are disposed opposite to each other and aligned so that the metal plates 30a, 30b and the metal foils 10bc, 10acb are opposite to each other. The metal plate 30a and the metal foil 10bc, and also the metal plate 30b and the metal foil 10acb are joined together via the solder layer 13.

As a result, the metal foil 10bc and the emitter electrode 20ae provided on the side of the semiconductor element 20a that is opposite to that of the collector electrode, and also the metal foil 10acb and the emitter electrode 20be provided on the side of the semiconductor element 20b that is opposite to that of the collector electrode of are electrically connected to each other via the metal plates 30a, 30b.

Thus, the emitter electrode 20ae of the semiconductor element 20a and the collector electrode of the semiconductor element 20b are connected in series by means of the metal foil 10bc. Further, the external connection terminal 10p serving as a positive electrode input terminal is electrically connected to the collector electrode of the semiconductor element 20a, and the external connection terminal 10n serving as a negative electrode input terminal is electrically connected to the emitter electrode 20be of the semiconductor element 20b. The external connection terminal 10m serving as an AC output terminal is electrically connected via the metal foil 10bc to an intermediate node in which the emitter electrode 20ae of the semiconductor element 20a and the collector electrode of the semiconductor element 20b are connected in series.

The insulating substrates 10A, 10B, metal plates 30a, 30b, and semiconductor elements 20a, 20b are thus electrically connected and also thermally connected.

Then, similarly to the configuration shown by way of example in FIGS. 5(A) to 5(C), the sealing resin 50 is provided in the gap between the insulating substrates 10A, 10B and on the side surfaces of the insulating substrates with the object of protecting the insulating substrates 10A, 10B, semiconductor elements 20a, 20b, and metal wire 20w.

In this case, the sealing resin 50 is provided such that the main surface of the metal foil 10ab provided on the insulating substrate 10A and the main surface of the metal foil 10bb provided on the insulating substrate 10B are exposed from the sealing resin 50 and exhibited.

The basic structure of a semiconductor device having a 2 in 1 structure is completed by such a manufacturing method. The heat-dissipating fins 40 are then thermally connected via solder materials or electrically conductive compounds to the main surfaces of the metal foils 10ab, 10bb. Alternatively, the heat dissipating fins 40 are directly joined to the main surfaces of the metal foils 10ab, 10bb.

In the embodiment illustrated by FIGS. 2(A) to 7(C), RC-IGBT elements are applied to two semiconductor elements 20a, 20b and main electrodes of different types of these RC-IGBT elements are connected in series, but a semiconductor device in which main electrodes of the same kind are connected in parallel can be also manufactured.

Figure 8:
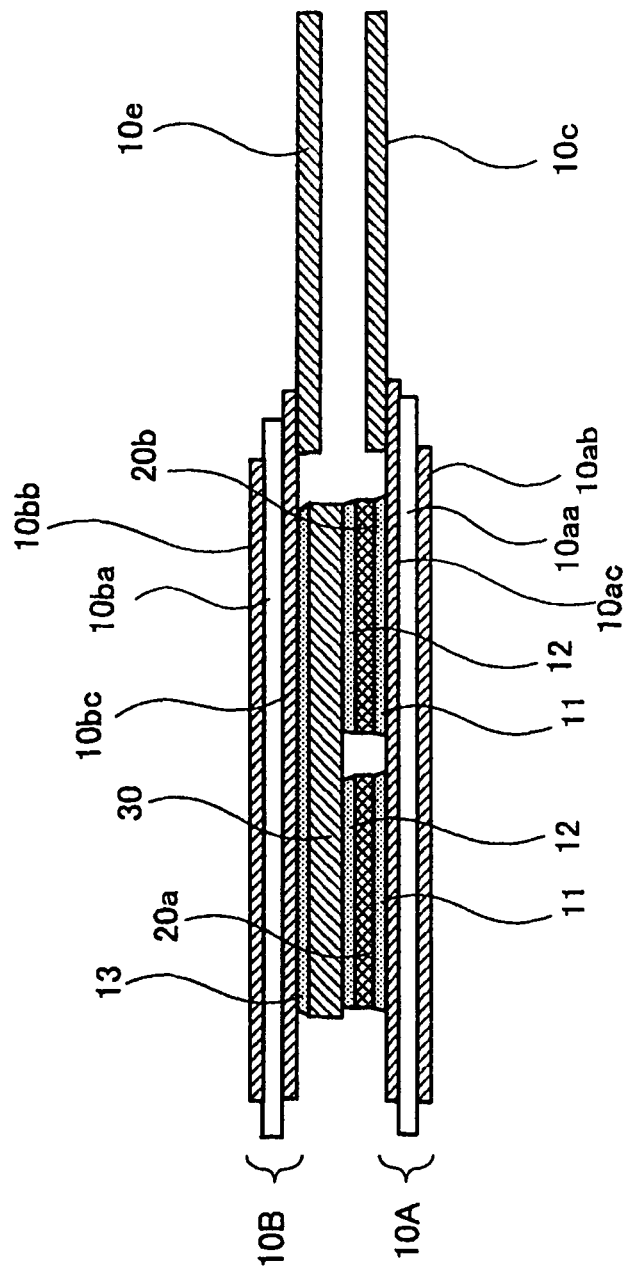
FIG. 8 is a principal schematic view illustrating another method for manufacturing a semiconductor device according to the first embodiment (third view).

For example, FIG. 8 is a principal schematic view illustrating another method for manufacturing a semiconductor device according to the first embodiment.

In the basic structure of the semiconductor device, the semiconductor elements 20a, 20b are joined via the solder layer 11 to the metal foil 10ac of the insulating substrate 10A, and the collector electrodes of the semiconductor elements 20a, 20b are electrically connected to each other by means of the metal foil 10ac. The metal plate 30 is joined via the solder layer 12 to the emitter electrodes 20ae, 20be of the semiconductor elements 20a, 20b, and the emitter electrodes 20ae, 20be of the semiconductor elements 20a, 20b are electrically connected to each other via the metal plate 30. The metal foil 10bc of the insulating substrate 10B is joined to the metal plate 30 via the solder layer 13. Further, the external connection terminals 10c, 10e are electrically connected to the metal foils 10ac, 10bc, respectively. The basic structure of such semiconductor device can be assembled, for example, in the following manner.

For example, a unit is prepared that has the insulating substrate 10A provided with the metal foil 10ac, the semiconductor element 20a that is joined by the collector electrode to the metal foil 10ac via the solder layer 11, the semiconductor element 20b that is joined by the collector electrode to the metal foil 10ac via the solder layer 11, and the metal plate 30 that ensures electrical continuity between the emitter electrode 20ae provided on the side of the semiconductor element 20a that is opposite to the collector electrode and the emitter electrode 20be provided on the side of the semiconductor element 20b that is opposite to the collector electrode, and the insulating substrate 10B provided with the metal foil 10bc is disposed opposite to the unit. The metal foil 10bc and the metal plate 30 are then joined via the solder layer 13.

Thus, the basic structure of the semiconductor device shown by way of example in FIG. 8 is provided with the insulating substrate 10A; the insulating substrate 10B provided so as to face the insulating substrate 10A; the semiconductor element 20a, which is disposed in the gap between the insulating substrate 10A and the insulating substrate 10B, having the collector electrode and the emitter electrode 20ae provided on the side opposite to that of the collector electrode; and the semiconductor element 20b having the collector electrode and the emitter electrode 20be provided on the side opposite to that of the collector electrode. The collector electrode of the semiconductor element 20a and the collector electrode of the semiconductor element 20b are electrically connected via the metal foil 10ac provided on the insulating substrate 10A, and the emitter electrode 20ae and the emitter electrode 20be are electrically connected via the metal plate 30 joined to the metal foil 10bc of the insulating substrate 10B.

By using such a basic structure, it is also possible to manufacture a semiconductor device in which main electrodes of the same kind are connected in parallel.

Further, in the case of parallel connection, the semiconductor element 20a may be an IGBT element and the semiconductor element 20b may be a FWD element. In this case, the collector electrode of the semiconductor element 20a, which is the IGBT element, and the cathode electrode of the semiconductor element 20b, which is the FWD element, are electrically connected by means of the metal foil 10ac. The emitter electrode of the semiconductor element 20a, which is the IGBT element, and the anode electrode of the semiconductor element 20b, which is the FWD element, are electrically connected by means of the metal plate 30.

In this case, an example is considered in which a plurality of identical or different semiconductor elements are mounted, but it goes without saying that a semiconductor device may be constituted by mounting one semiconductor element of any kind.

If necessary, a plurality of semiconductor devices 1 obtained in the above-described manner may be stacked with the heat-dissipating fins 40 being interposed therebetween.

Figure 9:
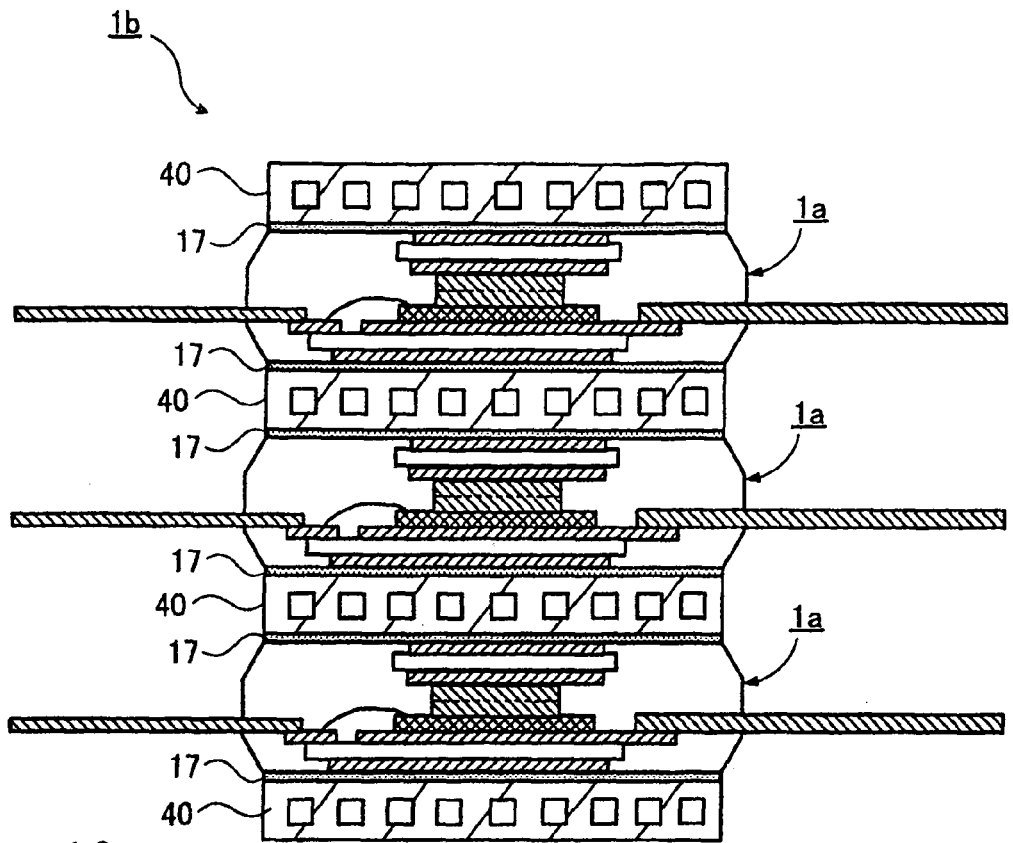
FIG. 9 is a principal cross-sectional view of a configuration example of a semiconductor device having a stacked structure.

FIG. 9 is a principal cross-sectional view of a configuration example of a semiconductor device having a stacked structure.

FIG. 9 shows a semiconductor device 1b of a 6 in 1 structure in which semiconductor devices 1a having a 2 in 1 structure such as shown in FIGS. 6(A) and 6(B) are stacked, with the heat-dissipating fins 40 being interposed therebetween. FIG. 9 shows an example of a cross section corresponding to the X7-Y7 cross section in FIGS. 6(A) and 6(B).

In this case, a lead-free solder layer of a tin (Sn)-silver (Ag) system, a lead-containing solder layer of a tin (Sn)-lead (Pb) system, or an electrically conducive compound can be used as the connection member 17 that thermally connects the semiconductor devices 1a and heat-dissipating fins 40. The connection member 17 can be formed to a thickness of 100 μm to 300 μm. Further, heat-dissipating fins 40 can be also directly joined to each semiconductor device 1a rather than via the connection member 17.

For example, an inverter circuit device of a 6 in 1 structure can be easily formed by stacking three semiconductor devices 1a of a 2 in 1 structure with the heat-dissipating fins 40 being interposed therebetween.

A plurality of semiconductor devices 1 such as shown in FIG. 1 and the semiconductor devices obtained from the basic structures such as shown by way of example in FIGS. 7(A) to 7(C) and 8 can be also stacked with the heat-dissipating fins 40 being interposed therebetween, in the same manner as in the example shown in FIG. 9. Further, a plurality of semiconductor devices of the same structure can be stacked, with the heat-dissipating fins 40 being interposed therebetween, and also semiconductor devices of different structures that require heat dissipation can be also stacked with the heat-dissipating fins 40 being interposed therebetween.

As described hereinabove, the semiconductor device according to the first embodiment is provided with the insulating substrate 10A, the insulating substrate 10B provided so as to face the insulating substrate 10A, and at least one semiconductor element 20 disposed in the gap between the insulating substrate 10A and the insulating substrate 10B and having a main electrode and another main electrode provided on the side opposite to that of the main electrode. The main electrode is electrically connected to at least one metal foil 10ac provided at the insulating substrate 10A, and the other main electrode is electrically connected to at least one metal foil 10bc provided at the insulating substrate 10B.

With such a semiconductor device, good electrical connection can be realized on the upper and lower main surfaces of the mounted semiconductor elements, and heat dissipation can be efficiently conducted from the upper and lower main surfaces of the semiconductor element and also from the upper and lower main surfaces of the semiconductor device where the semiconductor elements have been mounted. Therefore, a highly reliable semiconductor device can be realized.

Further, by disposing the thin insulating substrates 10A, 10B opposite to each other, it is possible to reduce the semiconductor device in thickness and miniaturize the device.

<Second Embodiment>

Figure 10:
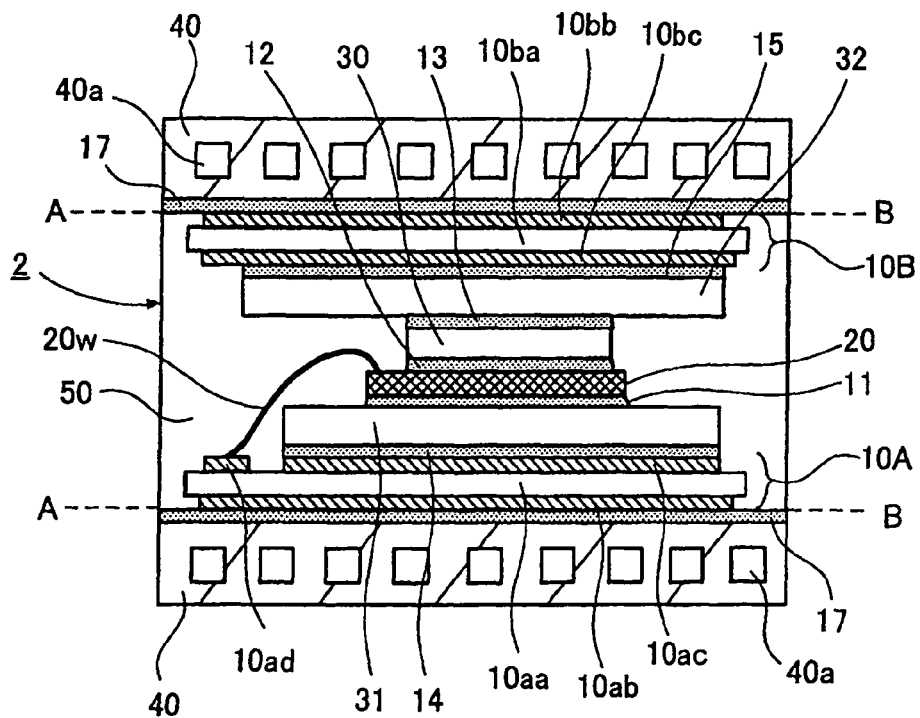
FIG. 10 is a schematic diagram of the semiconductor device according to the second embodiment.

FIG. 10 is a schematic drawing illustrating a semiconductor device according to the second embodiment.

As shown in the figure, in a semiconductor device (semiconductor package) 2, an insulating substrate 10A is used as a base body and a metal block body 31 is mounted on the insulating substrate 10A. At least one semiconductor element 20 is mounted on the metal block body 31.

In this case, the insulating substrate 10A is provided with an insulating plate 10aa, a metal foil 10ab provide on the lower surface of the insulating plate 10aa, and metal foils 10ac, 10ad provided on the upper surface of the insulating plate 10aa. The metal foil 10ab and the metal foils 10ac, 10ad are selectively provided in respective predetermined regions on the upper and lower surfaces of the insulating plate 10aa and are thus separated by the insulating plate 10aa. The metal foils 10ab, 10ac, and 10ad can be formed using, for example, the DCB method.

Further, the semiconductor element 20 is the so-called power semiconductor element and, for example, corresponds to a RC-IGBT element. In addition to the RC-IGBT element, for example, a usual IGBT element, a power MOSFET, and a FWD element can be disposed as the semiconductor element 20.

In the semiconductor device 2, the metal block body 31 is joined via a lead-free solder layer 14 to the metal foil 10ac provided on the insulating substrate 10A. One main electrode (for example, a collector electrode) of the semiconductor element 20 is joined via a solder layer 11 to the metal block body 31. A metal plate 30 that functions as a heat spreader or a lead frame is joined via a lead-free solder layer 12 to the other main electrode (for example, an emitter electrode) provided on the main surface on the side opposite to that of the main surface where the aforementioned one main electrode (for example, the collector electrode) of the semiconductor element 20 is disposed. A control electrode (not shown in the figure) of the semiconductor element 20 that is separately provided on the surface side where the other main electrode (for example, the emitter electrode is disposed) and the metal foil 10ad provided together with the metal foil 10ac on the insulating plate 10aa are electrically connected by means of a metal wire 20w.

Further, in the semiconductor device 2, a separate insulating substrate 10B that is a base body is disposed opposite to the insulating substrate 10A.

The insulating substrate 10B is provided with an insulating plate 10ba, a metal foil 10bb provided on the upper surface of the insulating plate 10ba, and a metal foil 10bc provided on the lower surface of the insulating plate 10ba. The metal foil 10bb and the metal foil 10bc are selectively and respectively provided on the upper and lower surface of the insulating plate 10ba and separated by the insulating plate 10ba. The metal foils 10bb and 10bc can be formed using, for example, the DCB method.

In the semiconductor device 2, a metal block body 32 is joined via a lead-free solder layer 15 to the metal foil 10bc provided on the insulating substrate 10B. The metal plate 30 and the metal block body 32 are joined via a lead-free solder layer 13.

The insulating substrates 10A, 10B, metal plate 30, metal block bodies 31, 32, and semiconductor element 20 are electrically and thermally connected to each other.

Further, in the semiconductor device 2, a sealing resin 50 is provided in a gap between the insulating substrates 10A, 10B and on the side surfaces thereof with the object of protecting the insulating substrates 10A, 10B, semiconductor element 20, and metal wire 20w. The main surfaces of the metal foils 10ab, 10bb provided on the sides of the insulating substrates 10A, 10B that are opposite to the sides facing the semiconductor element 20 are exposed from the sealing resin 50 and exhibited, that is, not covered by the sealing resin 50. In the semiconductor device 2, flat surfaces are formed by the main surfaces of the metal foils 10ab, 10bb and also main surfaces (surfaces along the broken lines A-B in the figure) constituted by parts of the sealing resin 50.

Further, in the semiconductor device 2, a heat-dissipating fin 40 is thermally connected via a connection member (not shown in the FIG. 17 to the metal foil 10ab provided on the insulating substrate 10A. Further, a heat-dissipating fin 40 is also thermally connected via the connection member 17 to the metal foil 10bb provided on the insulating substrate 10B. In this case, for example, a conductive compound, a lead-free solder material of a tin (Sn)-silver (Ag) system, or a solder material of a tin (Sn)-lead (Pb) system can be used for the connection member 17. When a solder material is used, the metal foils 10ab, 10bb and the heat-dissipating fins 40 can be strongly joined via the solder material to perform reflow processing.

The heat-dissipating fins 40 may be of a water-cooled system or an air-cooled system. If necessary, the heat-dissipating fins 40 may be directly, that is not via the connection member 17, joined by pressurization to the metal foils 10ab, 10bb, by clamping from the outside.

For example, a ceramic material containing at least any of silicon nitride (SiN), alumina ($Al_2O_3$), and aluminum nitride (AlN) can be used for the above-described insulating plates 10aa, 10ba.

For example, copper (Cu) or a metal containing copper (Cu) as the main component can be used for the metal foils 10ab, 10ac, 10ad, 10bb, and 10bc and metal block bodies 31 and 32.

For example, a material containing copper (Cu), or aluminum (Al), or alloys thereof as the main component can be also used for the heat-dissipating fins 40.

For example, aluminum (Al) and gold (Au) can be used for the metal wire 20w.

For example, any of silicone gel, an epoxy resin, a cyanate resin, and a silicone resin can be used as the sealing resin 50. If necessary, a filler material constituted by an inorganic material (boron nitride (BN), aluminum nitride (AlN), and silicon nitride (SiN)) may be contained in the resin.

The thickness of the insulating plates 10aa, 10ba is 0.2 mm to 0.7 mm, and the thickness of the metal foils 10ab, 10ac, 10ad, 10bb, and 10bc is 0.2 mm to 1.0 mm.

By providing such thin insulating substrates 10A, 10B above and below the semiconductor element 20 and connecting the components, it is possible to conduct heat efficiently, which is generated from the semiconductor element 20 from the upper and lower main surfaces of the semiconductor element 20 to the upper and lower heat-dissipating fins 40 via the insulating substrate 10A and the insulating plate 10B.

Further, since metal block bodies 31, 32 are disposed above and below the semiconductor element 20 in the semiconductor device 2, heat generated from the semiconductor element 20 can be dissipated in the metal block bodies 31, 32.

Thus, in the semiconductor device 2, the upper and lower main electrodes of the semiconductor element 20 have good electrical connection to the metal foil 10ac provided on the insulating substrate 10A and to the metal foil 10bc provided on the insulating substrate 10B. At the same time, heat generated from the semiconductor element 20 can be efficiently dissipated in the metal block bodies 31, 32 and efficiently conducted from the upper and lower main surfaces of the semiconductor element 20 to the upper and lower heat-emitting fins 40 via the insulating substrate 10A and the insulating substrate 10B. As a result, reliability of the semiconductor device 2 can be increased. In particular, since the metal block bodies 31, 32 are disposed, heat generated from the semiconductor element 20 is not concentrated in parts of the insulating substrates 10A, 10B. Therefore, heat generated from the semiconductor element 20 can be efficiently conducted from almost the entire region of the insulating substrates 10A, 10B to the upper and lower heat-dissipating fins 40.

Thus, in the semiconductor device 2, a metal block body 31 is disposed between the collector electrode of the semiconductor element 20 and the metal foil 10ac. Further, the metal plate 30 and the metal block body 32 are disposed between the emitter electrode of the semiconductor element 20 and the metal foil 10bc.

If necessary, either of the metal block bodies 31, 32 may be omitted.

A semiconductor device carrying a plurality of semiconductor elements 20 can be also constituted following the example of the semiconductor device 2 shown in FIG. 10. For example, a semiconductor device of a 2 in 1 structure such as explained in the first embodiment can be also formed.

If necessary, a plurality of semiconductor devices 2 can be stacked with the heat-dissipating fins 40 being interposed therebetween, in the same manner as the semiconductor devices shown in FIG. 9 and described in the first embodiment. A lead-free solder layer of a tin (Sn)-silver (Ag) system, a lead-containing solder layer of a tin (Sn)-lead (Pb) system, or an electrically conductive compound can be used as the connection member that thermally connects the semiconductor devices 2 and heat-dissipating fins 40. A semiconductor device of a structure different from that of the semiconductor device 2 can be also stacked therewith, with the heat-dissipating fin 40 being interposed therebetween.

<Third Embodiment>

Figure 11:
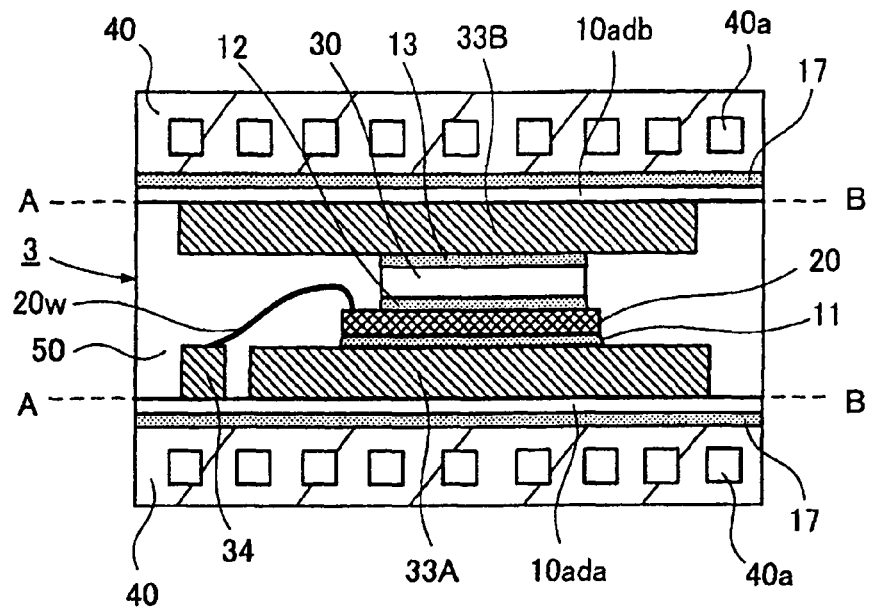
FIG. 11 is a schematic diagram of the semiconductor device according to the third embodiment.

FIG. 11 is a schematic drawing illustrating a semiconductor device according to the third embodiment.

As shown in the figure, in a semiconductor device (semiconductor package) 3, a metal plate (die pad) 33A is used as a base body and at least one semiconductor element 20 is mounted on the metal plate 33A.

In this case, the semiconductor element 20 is the so-called power semiconductor element and, for example, corresponds to a RC-IGBT element. In addition to the RC-IGBT element, for example, a usual IGBT element, a power MOSFET, and a FWD element can be disposed as the semiconductor element 20.

In the semiconductor device 3, one main electrode (for example, a collector electrode) of the semiconductor element 20 is joined via a solder layer 11 to the metal plate 33A. A metal plate 30 that functions as a heat spreader or a lead frame is joined via a lead-free solder layer 12 to the other main electrode (for example, an emitter electrode), which is provided oh the main surface on the side opposite to that of the main surface where the aforementioned one main electrode (for example, the collector electrode) of the semiconductor element 20 is disposed. A control electrode (not shown in the figure) of the semiconductor element 20 that is separately provided on the surface side where the other main electrode (for example, the emitter electrode is disposed) and a metal plate 34 disposed apart from the metal plate 33A are electrically connected by means of a metal wire 20w.

Further, in the semiconductor device 3, a separate metal plate (die pad) 33B that is a base body is disposed opposite to the metal plate 33A. The metal plate 30 and the metal plate 33B are joined via a lead-free solder layer 13.

The metal plates 33A, 33B, metal plate 30, and semiconductor element 20 are electrically and thermally connected to each other.

Further, in the semiconductor device 3, a sealing resin 50 is provided in a gap between the metal plates 33A, 33B and on the side surfaces thereof and also on the side surface and upper surface of the metal plate 34 with the object of protecting the metal plates 33A, 33B, 34, semiconductor element 20, and metal wire 20w. The main surfaces of the metal plates 33A, 33B on the sides opposite to those of the main surfaces that face the semiconductor element 20 and also the lower surface of the metal plate 34 are exposed from the sealing resin 50 and exhibited, that is, not covered by the sealing resin 50.

In the semiconductor device 3, flat surfaces are formed by the main surfaces of the metal plates 33A, 33B on the sides opposite to those of the main surfaces that face the semiconductor element 20, the lower surface of the metal plate 34, and also main surfaces (surfaces along the broken lines A-B in the figure), which is constituted by parts of the sealing resin 50.

Insulating layers 10ada, 10adb are formed on the aforementioned flat surfaces by using an aerosol deposition (AD) method by which a starting material power is blown and deposited on a surface where the film is to be formed.

With the aerosol deposition method, first, aerosol in which particles are contained in a carrier gas is produced by causing a predetermined carrier gas to flow in a fluidized bed including particles that serve as a starting material for the insulating layers 10ada, 10adb. Then, the produced aerosol is blown onto the surface where the film is to be formed, that is, on the flat surface constituted by the metal plates 33A, 33B, 34 and part of the sealing resin 50 under a reduced pressure in a low-temperature environment, such as normal temperature environment. In this case, the particles colliding with the surface where the film is to be formed are crushed or deformed by the impact during collision and are deposited on the surface where the film is to be formed. Under the effect of collision energy, the particles strongly adhere to and are deposited on the surface where the film is to be formed and the film that has been heretofore formed on the surface where the film is to be formed.

For example, particles with a size of about 1 nm to 3 μm, preferably about 5 nm to 1 μm can be used for the particles serving as a starting material. By adjusting an aerosol blowing nozzle or pressure conditions, it is possible to accelerate the particles to a velocity of about several tens to several hundreds of meters per second, for example, from about 5 m/sec to 500 m/sec. As a result of collision with the surface where the film is to be formed, the particles are crushed and deformed to a side of about several tens of nanometers, for example, a side of about 0.5 nm to 50 nm. A film in which fragments of such a size are joined together, which contains no voids, and which has a dense nanostructure such that grain boundaries cannot be identified is formed on the surface.

By using such aerosol deposition method, it is possible to form flat insulating layers 10ada, 10adb that have good adhesion to the surface and dense nanostructure to a desired film thickness of about several micrometers to several hundreds of micrometers, for example, a thickness of 10 μm to 100 μm. Further, when the aerosol deposition method is used, the effect of residual stresses, which appears in substrates of sintered bodies, can be avoided.

Further, in the semiconductor device 3, a heat-dissipating fin 40 is thermally connected via a connection member 17 to the main surface of the insulating layer 10ada on the side opposite to that of the main surface that faces the semiconductor element 20. A heat-dissipating fin 40 is also thermally connected via a connection member 17 to the main surface of the insulating layer 10adb on the side opposite to that of the main surface that faces the semiconductor element 20. For example, an electrically conductive compound is used for the connection members 17 used herein. Heat-dissipating fins 40 may be of a water-cooled system or an air-cooled system. If necessary, heat-dissipating fins 40 may be directly, that is, not via the connection member 17, joined by pressurization to the insulating layers 10ada, 10adb, by clamping from the outside.

For example, a ceramic material containing at least any of silicon nitride (SiN), alumina ($Al_2O_3$), aluminum nitride (AlN), and boron nitride (BN) can be used for the above-described insulating layers 10ada, 10adb. When the insulating layers 10ada, 10adb are formed using the aerosol deposition method, ceramic particles of these materials can be used.

For example, copper (Cu) or a metal containing copper (Cu) as the main component can be used for the metal plates 33A, 33B, and 34.

For example, a material containing copper (Cu), or aluminum (Al), or alloys thereof as the main component can be also used for heat-dissipating fin 40.

For example, aluminum (Al) and gold (Au) can be used for the metal wire 20w.

For example, any of silicone gel, an epoxy resin, a cyanate resin, and a silicone resin can be used as the sealing resin 50. If necessary, a filler material constituted by an inorganic material (boron nitride (BN), aluminum nitride (AlN), and silicon nitride (SiN)) may be contained in the resin.

Thus, the semiconductor device 3 is provided with at least one semiconductor element having a main electrode and another main electrode provided on the side opposite to that of the aforementioned main electrode, the metal plate 33A joined to the main electrode, and the metal plate 33b electrically connected to the other main electrode. Further, the insulating layer 10ada is formed on the surface of the metal plate 33A that is opposite to the surface joined to the main electrode, and the insulating layer 10adb is formed on the surface of the metal plate 33B that is opposite to the surface electrically connected to the other main electrode.

By disposing such metal plates 33A, 33B above and below the semiconductor element 20, it is possible to efficiently conduct the heat generated from the semiconductor element 20 from the upper and lower main surfaces of the semiconductor element 20 to the upper and lower heat-dissipating fins 40 via the metal plate 33A and the metal plate 33B.

Thus, in the semiconductor device 3, the upper and lower main electrodes of the semiconductor element 20 have good electrical connection to the metal plates 33A, 33B, and heat generated from the semiconductor element 20 can be efficiently dissipated in the metal plates 33A, 33B and be efficiently conducted from the upper and lower main surfaces of the semiconductor element 20 to the upper and lower heat-emitting fins 40. As a result, reliability of the semiconductor device 3 can be increased.

In particular, where the insulating layers 10ada, 10adb are formed by the aerosol deposition method so as to have small thickness, high density and good adhesion to the metal plates 33A, 33B, thermal resistance in the insulating layers 10ada, 10adb can be inhibited while ensuring high insulating ability and heat generated from the semiconductor element 20 can be efficiently conducted to the upper and lower heat-dissipating fins 40.

For example, when substrates from ceramic sintered bodies are used for portions of the insulating layers 10ada, 10adb, substrates with a thickness of 0.2 mm to 0.7 mm can be used with consideration for insulating capacity and breakdown voltage. By contrasts, when ceramic layers are formed using the aerosol deposition method in portions of the insulating layers 10ada, 10adb, since the ceramic layers can be formed to have a dense structure containing no voids or the like, the insulating capacity is increased by a factor of about 10. In other words, when ceramic layers are formed using the aerosol deposition method, the thickness can be reduced to about $\frac{1}{10}$ that of the semiconductor sintered body substrate while ensuring similar insulating capacity. Therefore, a contribution is made to the reduction of thickness and the miniaturization of the semiconductor device 3.

Further, the ceramic layer formed by using the aerosol deposition method has thermal conductivity similar to that of the bulk body. Thus, it is possible to ensure thermal conductivity of about 80 W/m·K with silicon nitride (SiN), about 20 W/m·K with alumina ($Al_2O_3$), and about 160 W/m·K to about 180 W/m·K with aluminum nitride (AlN). As described hereinabove, the semiconductor layer formed using the aerosol deposition method can be formed to a smaller thickness due to the production method thereof and insulating capacity. Therefore, thermal resistance of the ceramic layer can be reduced. Therefore, when the insulating layers 10ada, 10adb are formed using the aerosol deposition method, thermal conduction to heat-dissipating fins 40 can be ensured without forming metal foils on the surfaces of the insulating layers 10ada, 10adb that are on the side opposite to that of the metal plates 33A, 33B.

Furthermore, when the aerosol deposition method is thus used, since an insulating layer such as a ceramic layer can be deposited on the surface where the film is to be formed (flat surface), which is obtained after the sealing resin 50 has been formed, it is not necessary to prepare the insulating plates 10aa, 10ba of a predetermined size in advance and form the insulating substrates 10A, 10B provided with the predetermined metal foils by using the prepared insulating plates. As a result, the manufacturing process can be simplified and cost can be reduced.

For example, an insulating layer can be formed in the following manner by the aerosol deposition method.

Figure 12:
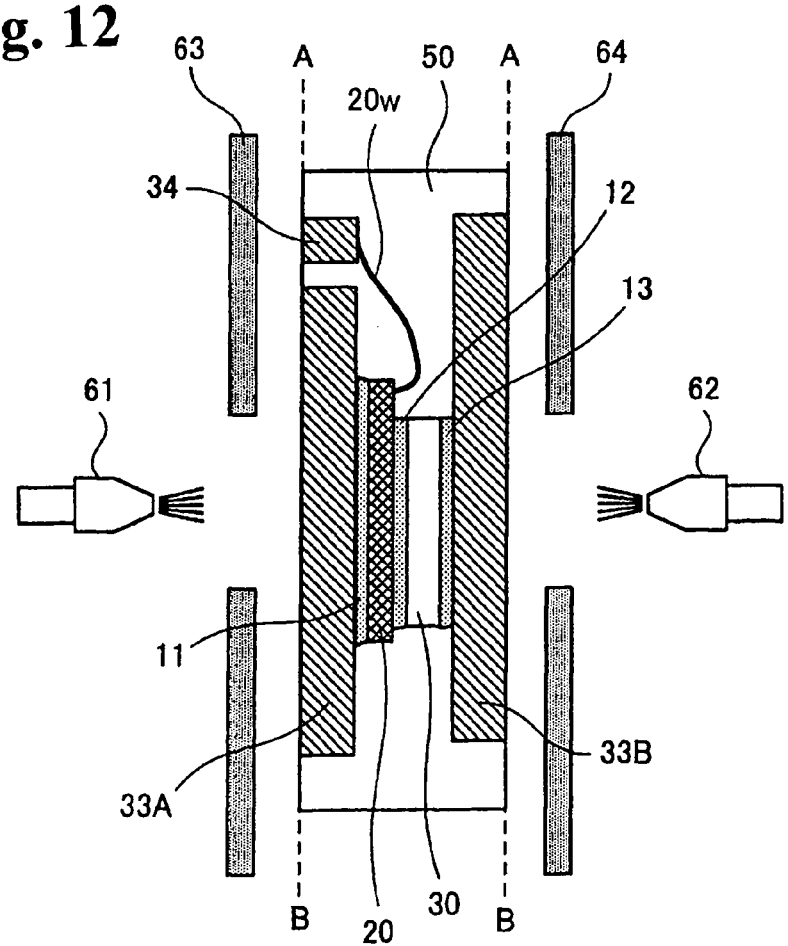
FIG. 12 is an explanatory drawing illustrating an example of the insulating layer formation process using an aerosol deposition method.
Figure 13:
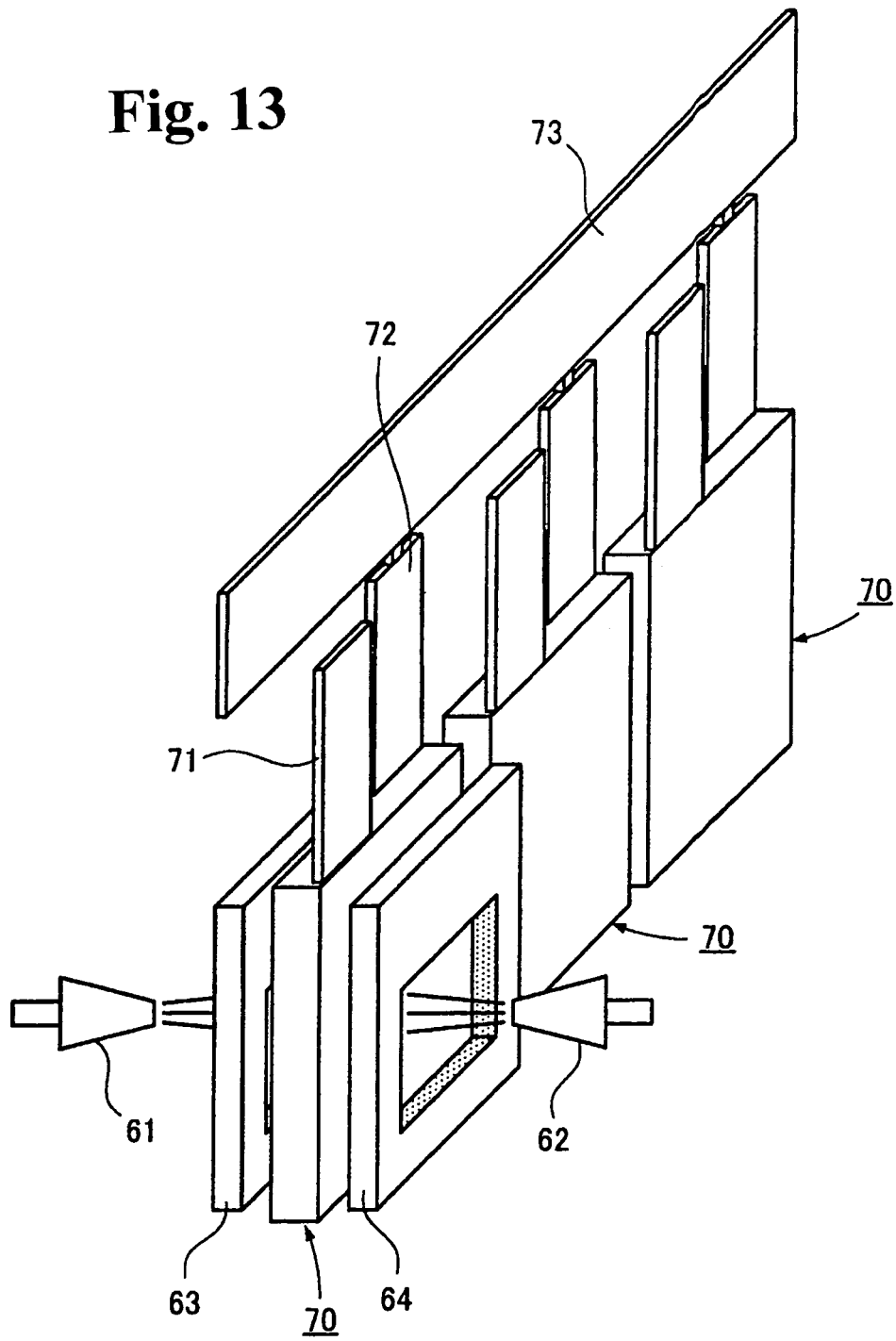
FIG. 13 is an explanatory drawing illustrating another example of the insulating layer formation process using an aerosol deposition method.

FIG. 12 is an explanatory drawing illustrating an example of the insulating layer formation process using the aerosol deposition method. FIG. 13 is an explanatory drawing illustrating another example of the insulating layer formation process using the aerosol deposition method.

For example, first, the semiconductor element 20 and the metal wire 20w are sealed with the synthetic resin 50, and the predetermined main surfaces of the metal plates 33A, 33B, and 34 being left uncovered. Then, as shown in FIG. 12, an aerosol containing predetermined particles is blown from nozzles 61, 62 respectively onto the surface where the metal plates 33A, 34 are exposed from the synthetic resin 50 and the surface where the metal plate 33B is exposed from the synthetic resin 50. By moving the nozzles 61, 62 according to the predetermined drawing pattern, it is possible to blow the aerosol so as to form the insulating layers selectively in the desired regions. Further, the aerosol can be prevented from adhering to the unnecessary portions by disposing the metal masks 63, 64 opposite to the surface where the metal plates 33A, 34 are exposed from the synthetic resin 50 and the surface where the metal plate 33B is exposed from the synthetic resin 50. As a result, the insulating layers can be formed simultaneously on both surfaces where the synthetic resin 50 has been formed.

Further, with the mode of conducting aerosol deposition after the synthetic resin 50 has been formed, the insulating layers can be also formed as shown in FIG. 13. For example, after the synthetic resin 50 has been formed, a configuration is sometimes obtained such that a plurality of structural bodies 70 in which external connection terminals 71, 72, which have been pulled out of the synthetic resin 50, are connected to a tie bar 73. In the case of such a configuration, an aerosol containing predetermined particles is also blown from the nozzles 61, 62 onto both surfaces of each structural body 70. By moving the nozzles 61, 62 according to the predetermined drawing pattern, it is possible to blow the aerosol so as to form the insulating layers selectively in the desired regions. Further, the aerosol can be prevented from adhering to the unnecessary portions by disposing metal masks 63, 64 opposite to the surface where the metal plates 33A, 34 are exposed from the sealing resin 50 and the surface where the metal plate 33B is exposed from the sealing resin 50. As a result, the insulating layers can be formed simultaneously on both surfaces where the sealing resin 50 has been formed. Such blowing from the nozzles 61, 62 onto the structural bodies 70 may be conducted successively and continuously with respect to a plurality of structural bodies 70 and insulating layers may be formed on both surfaces of all of the structural bodies 70 that have been connected to the tie bar 73. In FIG. 13, the control terminals are omitted.

FIG. 12 and FIG. 13 illustrate the case in which the aerosol is blown from two opposing nozzles and the insulating layers are formed on both surface that are the objects of film formation, but it goes without saying that the insulating layers can be also formed on each surface by using one nozzle.

A semiconductor device carrying a plurality of semiconductor elements 20 can be also constituted following the example of the semiconductor device 3 shown in FIG. 11. For example, a semiconductor device of a 2 in 1 structure such as explained in the first embodiment can be also formed.

If necessary, a plurality of semiconductor devices 3 can be stacked, with the heat-dissipating fins 40 being interposed therebetween, in the same manner as the semiconductor devices shown in FIG. 9 and described in the first embodiment. In this case, an electrically conductive compound can be used as the connection member that thermally connects the semiconductor devices 3 and heat-dissipating fins 40. A semiconductor device of a structure different from that of the semiconductor device 3 can be also stacked therewith the heat-dissipating fin 40 being interposed therebetween.

<Fourth Embodiment>

Figure 14:
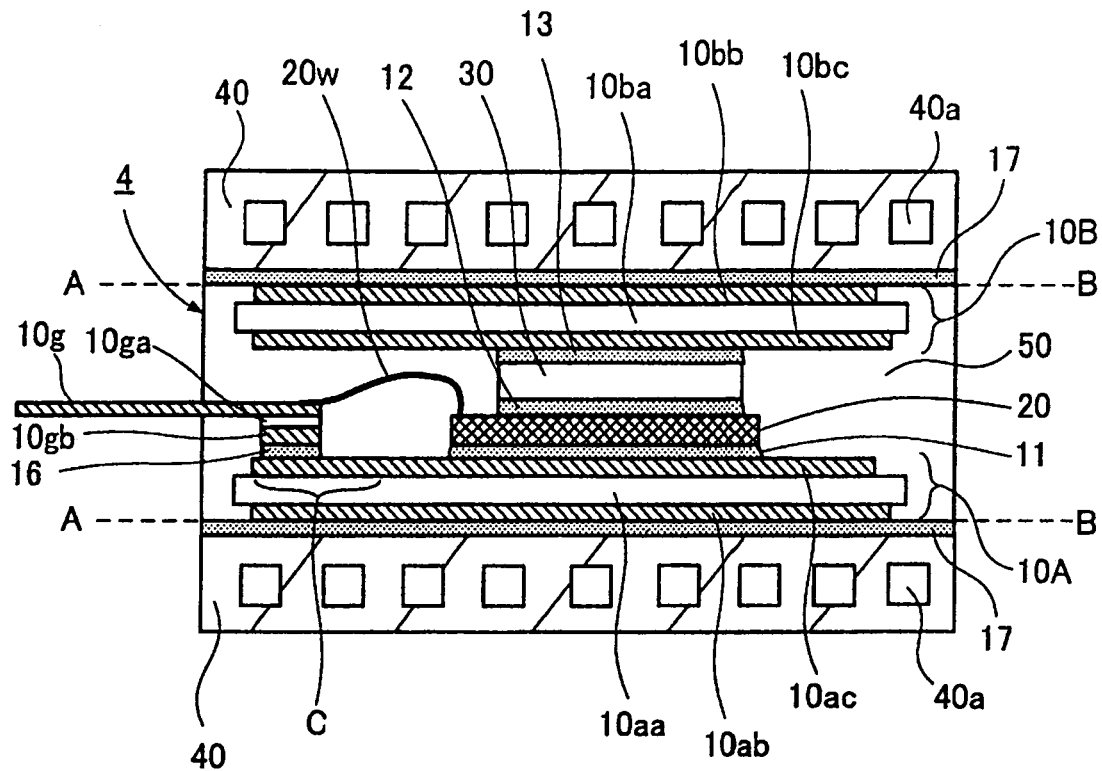
FIG. 14 is a schematic diagram of the semiconductor device according to the fourth embodiment.

FIG. 14 is a schematic drawing illustrating a semiconductor device according to the fourth embodiment.

In a semiconductor device 4 according to the fourth embodiment, a metal foil 10ac of an insulating substrate 10A is provided as far as the vicinity of the end portion (portion C in the figure) of an insulating plate 10aa.

Further, in the semiconductor device 4, an insulating plate 10ga is provided separately, a control terminal 10g is connected to the upper surface side of the insulating plate 10ga, and a metal foil 10gb is connected to the lower surface side of the insulating plate 10ga. The metal foil 10gb is joined to the end portion of the metal foil 10ac via a solder layer 16. The control terminal 10g and the metal foil 10gb can be formed for example by the DCB method.

With such an arrangement of the control terminal 10g and the like, the metal foil 10ac on the insulating plate 10aa can be provided as far as the vicinity of the end portion of the insulating plate 10aa, and the control terminal 10g and a control electrode of the semiconductor element 20 can be reliably electrically connected by means of a metal wire 20w. By extending the metal foil 10ac close to the end portion of the insulating plate 10aa, it is possible to dissipate heat efficiently, which is generated from the semiconductor element 20 also in the stretched portion (portion C in the figure) of the metal foil 10ac, and heat dissipation effect can be increased.

Thus, in the semiconductor device 4, good electrical connection can be realized on the upper and lower main surfaces of the semiconductor element 20 and heat dissipation can be efficiently conducted from the upper and lower main surfaces of the semiconductor element 20 and also from the upper and lower main surfaces of the semiconductor device 4 carrying the semiconductor element 20.

The insulating substrate 10A, control terminal 10g, insulating plate 10ga, and metal foil 10gb of such a structure may be applied to the semiconductor device 2 described in the second embodiment and also to the semiconductor device 3 described in the third embodiment. In the semiconductor device 3 described in the third embodiment, the metal plate 33A may be extended as far as the vicinity of the side surface of the sealing resin 50 and, as shown in FIG. 14, the control terminal 10g, insulating plate 10ga, and metal foil 10gb may be disposed on the metal plate 33A. As a result, electrical connection of the control terminal 10g and the control electrode can be reliably performed, and heat dissipation effect attained with the semiconductor devices 2 and 3 described in the second and third embodiments can be further increased.

<Fifth Embodiment>

Figure 15:
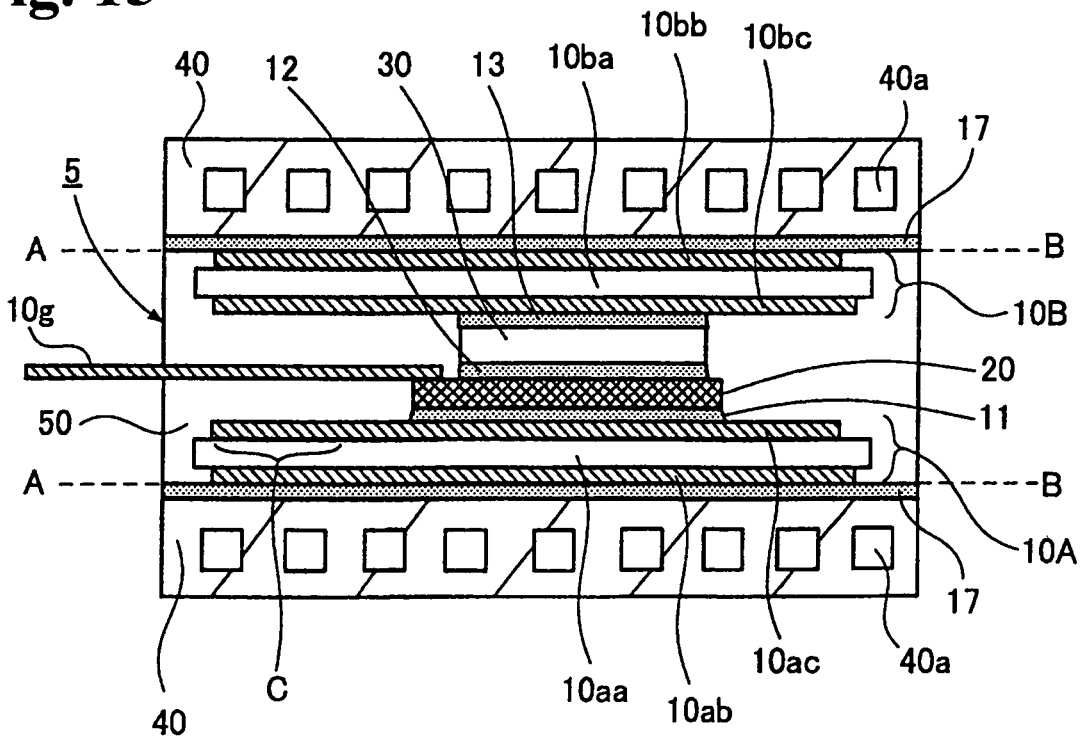
FIG. 15 is a schematic diagram of a semiconductor device according to the fifth embodiment.
Figure 16:
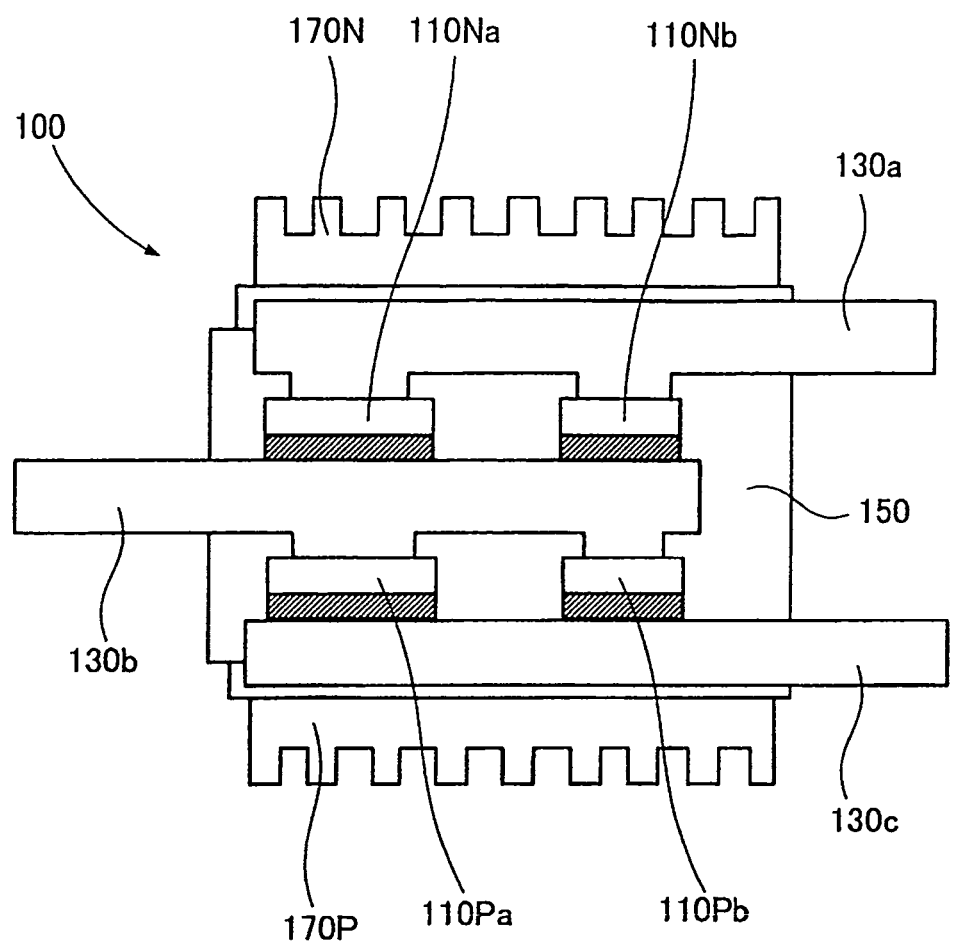
FIG. 16 is a principal view of a semiconductor deviance carrying a power semiconductor element.

FIG. 15 is a schematic drawing illustrating a semiconductor device according to the fifth embodiment.

In a semiconductor device 5 according to the fifth embodiment, a metal foil 10ac of an insulating substrate 10A is provided as far as the vicinity of the end portion (portion C in the figure) of an insulating plate 10aa. Further, an end portion of a control terminal 10g can be joined by any method such as laser welding, soldering, ultrasonic joining, and direct joining by heating under pressure to a control electrode that has been separately provided on an arrangement surface side of one main electrode (for example, an emitter electrode) of a semiconductor element 20.

With such an arrangement of the control terminal 10g and the like, the metal foil 10ac located on the insulating plate 10aa can be provided as far as the vicinity of the end portion of the insulating plate 10aa, and the control terminal 10g and the control electrode of the semiconductor element 20 can be reliably electrically connected in a wireless manner. By extending the metal foil 10ac close to the end portion of the insulating plate 10aa, it is possible to dissipate heat efficiently, which is generated from the semiconductor element

20 also in the stretched portion (portion C in the figure) of the metal foil 10ac, and heat dissipation effect can be increased.

Thus, in the semiconductor device 5, good electrical connection can be realized on the upper and lower main surfaces of the semiconductor element 20, and heat dissipation can be efficiently conducted from the upper and lower main surfaces of the semiconductor element 20 and also from the upper and lower main surfaces of the semiconductor device 5 carrying the semiconductor element 20.

Such connection of the control terminal 10g and the control electrode may be also applied to the semiconductor device 2 described in the second embodiment and the semiconductor device 3 described in the third embodiment. As a result, the electrically connection of the control terminal 10g and the control electrode can be reliably performed and heat dissipation effect of the semiconductor devices 2, 3 such as described in the second and third embodiments can be further improved.

In the explanation above, the case is described in which heat-dissipating fins are disposed on the upper and lower surface sides of the semiconductor device, but the same effect as described above can be also obtained with the semiconductor device in which a heat-dissipating fin is disposed on at least one of the upper and surface and lower surface.

The principle of the present invention is described in a simple manner. A large number of modifications and variations can be introduced by a person skilled in the art, the present invention is not limited to the above-described precise configurations and examples of applications, and all the corresponding variation examples and equivalents are assumed to be included into the scope of the present invention defined by the appended claims and equivalents thereof.

What is claimed is:

1. A semiconductor device comprising:
   a first substrate having a first insulating plate, a first metal foil having a portion provided in a region on an inner side from ends of a first main surface of the first insulating plate, and a second metal foil having a portion provided in a region on an inner side from ends of a second main surface of the first insulating plate;
   a second substrate having a second insulating plate, a third metal foil having a portion provided in a region on an inner side from ends of a first main surface of the second insulating plate, which is disposed so as to face the first metal foil, and a fourth metal foil having a portion provided in a region on an inner side from ends of a second main surface of the second insulating plate;
   a semiconductor element disposed between the first substrate and the second substrate, and having a first main electrode electrically connected to the first metal foil and a second main electrode electrically connected to the third metal foil;
   a terminal electrically connected to the semiconductor element and led out to the outside of the sealing resin,
   a third insulating plate; and
   a fifth metal foil provided on a first main surface of the third insulating plate and electrically connected to the first metal foil, wherein the terminal is connected to a second main surface of the third insulating plate and electrically connected by a wire to the semiconductor element,
   a sealing resin that seals the semiconductor element,
   wherein the sealing resin covers side surfaces and end surfaces of the first insulating plate on an outer side from the first metal foil and second metal foil, side surfaces and end surfaces of the second insulating plate on the outer side from the third metal foil and fourth metal foil, and side surfaces of the second metal foil and fourth metal foil, and
   a main surface of the second metal foil, which is on the side opposite to that of the first insulating plate, and a main surface of the fourth metal foil, which is on the side opposite to that of the second insulating plate, are exposed without the sealing resin.

2. A semiconductor device according to claim 1, wherein a metal member is disposed at least either between the first main electrode and the first metal foil or between the second main electrode and the third metal foil.

3. A semiconductor device according to claim 1, wherein at least one of the second metal foil and the fourth metal foil is thermally connected to a heat dissipating body.

4. A semiconductor device according to claim 1, wherein another semiconductor device is thermally connected to the heat dissipating body.

* * * * *

UNITED STATES PATENT AND TRADEMARK OFFICE
CERTIFICATE OF CORRECTION

PATENT NO.        : 8,450,845 B2
APPLICATION NO.   : 12/735926
DATED             : May 28, 2013
INVENTOR(S)       : Yoshinari Ikeda et al.

It is certified that error appears in the above-identified patent and that said Letters Patent is hereby corrected as shown below:

In the Specification:

Column 16, line 30 to 31, change "(not shown in the FIG. 17", to --(not shown in the figure) 17 to--.

Column 18, line 6 to 7, change "provided oh the main surface"', to --provided on the main surface--.

Signed and Sealed this
Seventeenth Day of September, 2013

Teresa Stanek Rea
*Deputy Director of the United States Patent and Trademark Office*